(12) United States Patent
Sasoglu et al.

(10) Patent No.: US 10,911,071 B2
(45) Date of Patent: Feb. 2, 2021

(54) APPARATUS, METHOD AND SYSTEM TO SUPPORT CODES WITH VARIABLE CODEWORD LENGTHS AND INFORMATION LENGTHS

(71) Applicant: INTEL CORPORATION, Santa Clara, CA (US)

(72) Inventors: Eren Sasoglu, Mountain View, CA (US); Wook Bong Lee, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 160 days.

(21) Appl. No.: 16/074,521

(22) PCT Filed: Jun. 13, 2016

(86) PCT No.: PCT/US2016/037254
§ 371 (c)(1),
(2) Date: Aug. 1, 2018

(87) PCT Pub. No.: WO2017/176302
PCT Pub. Date: Oct. 12, 2017

(65) Prior Publication Data
US 2019/0036552 A1 Jan. 31, 2019

Related U.S. Application Data

(60) Provisional application No. 62/320,097, filed on Apr. 8, 2016.

(51) Int. Cl.
*H03M 13/00* (2006.01)
*H03M 13/13* (2006.01)
*H04W 28/06* (2009.01)

(52) U.S. Cl.
CPC ........ *H03M 13/618* (2013.01); *H03M 13/13* (2013.01); *H03M 13/635* (2013.01); *H04W 28/06* (2013.01)

(58) Field of Classification Search
CPC .. H03M 13/618; H03M 13/635; H03M 13/13; H04W 28/06
See application file for complete search history.

(56) References Cited

U.S. PATENT DOCUMENTS 5,589,829 A * 12/1996 Astle ............... H03M 7/425
341/106
2011/0258522 A1 * 10/2011 Sakomizu ......... H03M 13/1194
714/790

(Continued)

FOREIGN PATENT DOCUMENTS

EP 2722993 A1 4/2014
WO 2015026148 A1 2/2015

OTHER PUBLICATIONS

J. Kim, J. Kim and S. Kim, "An efficient search on puncturing patterns for short polar codes," 2015 International Conference on Information and Communication Technology Convergence (ICTC), Jeju, 2015, pp. 182-184. (Year: 2015).*

(Continued)

*Primary Examiner* — Cynthia Britt
(74) *Attorney, Agent, or Firm* — Alliance IP, LLC

(57) ABSTRACT

The present disclosure includes systems and methods for supporting polar codewords with variable polar codeword lengths. Variable codeword length codewords are communicated using an n-bit encoder/n-bit decoder having n inputs and n corresponding outputs. Each input and each corresponding output is associated with a bit index. A set of bit indices to be shortened are selected. The encoder encodes n input bits to obtain n output bits. Each output bit that is (Continued)

associated with a bit index from the set of bit indices to be shortened is ignored. A codeword is generated from all of the remaining output bits.

24 Claims, 12 Drawing Sheets

(56) References Cited

U.S. PATENT DOCUMENTS

2015/0077277 A1    3/2015  Alhussien et al.
2015/0236715 A1*   8/2015  Alhussien ............... H03M 7/40
                                                          341/67
2016/0285479 A1*   9/2016  El-Khamy ........ H03M 13/6368

OTHER PUBLICATIONS

S. Hong, D. Hui and I. Marić, "On the catastrophic puncturing patterns for finite-length polar codes," 2016 50th Asilomar Conference on Signals, Systems and Computers, Pacific Grove, CA, 2016, pp. 235-239. (Year: 2016).*

L. Zhang, Z. Zhang, X. Wang, Q. Yu and Y. Chen, "On the puncturing patterns for punctured polar codes," 2014 IEEE International Symposium on Information Theory, Honolulu, HI, 2014, pp. 121-125. (Year: 2014).*

D. Shin, S. Lim and K. Yang, "Design of Length-Compatible Polar Codes Based on the Reduction of Polarizing Matrices," in IEEE Transactions on Communications, vol. 61, No. 7, pp. 2593-2599, Jul. 2013. (Year: 2013).*

Huawei, "Overview of Polar Codes", R1-162161, 3GPP TSG RAN WG1, Meeting #84bis, Busan, Korea, Agenda Item 8.1.6.1, Apr. 11-15, 2016, 7 pages.

Intel Corporation, "Channel Coding for New Radio Interface", R1-162387, 3GPP TSG RAN WG1 Meeting #84bis, Busan, South Korea, Agenda Item 8.1.6.1, Apr. 11-15, 2016, 4 pages.

Li, et al., "A Study of Polar Codes for MLC NAND Flash Memories", IEEE, International Conference on Computing, Networking and Communications, Invited Position Papers, Feb. 16, 2015, 5 pages.

PCT/US2016/037254, International Search Report and Written Opinion, dated Jan. 5, 2017, 19 pages.

Wang, et al., "A Novel Puncturing Scheme for Polar Codes", IEEE Communications Letters, vol. 18, No. 12, Dec. 12, 2014, 4 pages.

* cited by examiner

APPARATUS, METHOD AND SYSTEM TO SUPPORT CODES WITH VARIABLE CODEWORD LENGTHS AND INFORMATION LENGTHS

RELATED APPLICATION

This application is a national stage filing under 35 U.S.C. § 371 of International Patent Application No. PCT/US2016/037254, filed Jun. 13, 2016, which claims the benefit under 35 U.S.C. § 119(e) of U.S. Provisional Application No. 62/320,097 filed Apr. 8, 2016, each of which is incorporated by reference herein in its entirety.

TECHNICAL FIELD

The present disclosure relates to error-correction codes. More specifically, the present disclosure relates to error-correction codes that are derived from the Kronecker product matrix, including polar codes and Reed-Muller codes.

DETAILED DESCRIPTION

Figure 1:
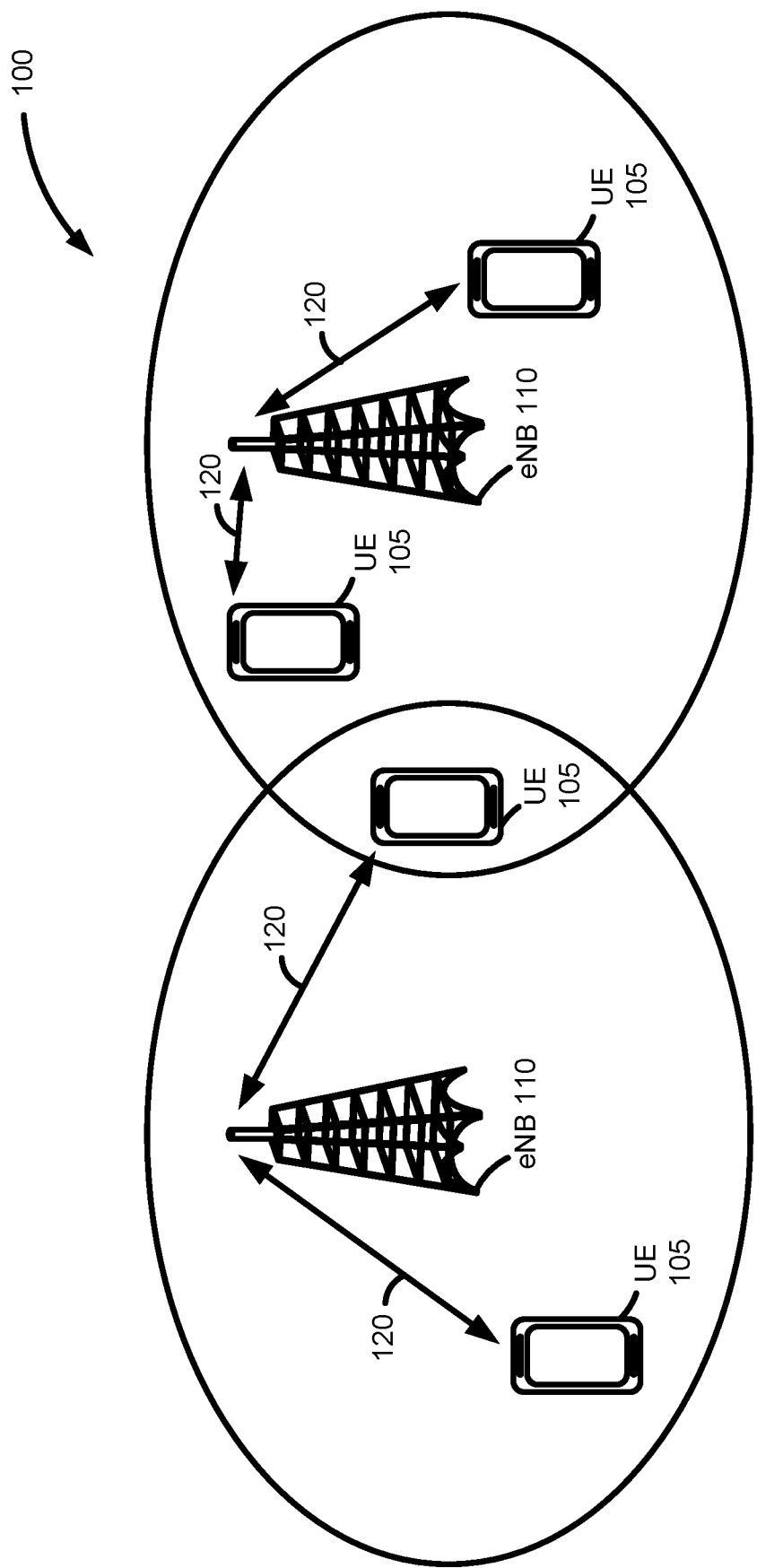
FIG. 1 illustrates an example of an environment in which the present systems and methods may be implemented.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

Wireless mobile communication technology uses various standards and protocols to transmit data between a base station and a wireless mobile device. Wireless communication system standards and protocols can include the 3rd Generation Partnership Project (3GPP) long term evolution (LTE); the Institute of Electrical and Electronics Engineers (IEEE) 802.16 standard, which is commonly known to industry groups as worldwide interoperability for microwave access (WiMAX); and the IEEE 802.11 standard, which is commonly known to industry groups as Wi-Fi. In 3GPP radio access networks (RANs) in LTE systems, the base station can include Evolved Universal Terrestrial Radio Access Network (E-UTRAN) Node Bs (also commonly denoted as evolved Node Bs, enhanced Node Bs, eNodeBs, or eNBs) and/or Radio Network Controllers (RNCs) in an E-UTRAN, which communicate with a wireless communication device, known as user equipment (UE).

Regardless of the standards and protocols used to transmit data between a source (e.g., base station, wireless mobile device) and a receiver (e.g., wireless mobile device, base station), wireless channels are subject to channel noise, which may result in errors being introduced during transmission between the source and the receiver. To mitigate channel errors, the data is encoded (with an error-correction code, for example) prior to transmission and decoded at the receiver with the anticipation that the error-correction codes correct transmission errors so that the data can be reconstructed at the receiver.

A common goal in cellular wireless networks (such as 3GPP networks) and in wireless networks in general includes efficient use of bandwidth. One way that bandwidth can be used more efficiently is to use more efficient error-correcting codes. As can be expected, different error-correction codes have different performance advantages and/or disadvantages. Therefore, bandwidth can be used more efficiently by using an error-correcting code that better utilizes the capacity of the communication channel. Polar codes, for instance, were constructed to provably achieve the channel capacity of all memoryless communication channels.

Polar codes and some other codes (e.g., Reed-Muller codes) are derived from Kronecker powers of a 2×2 matrix. For example, the encoder computes $X_1^N = U_1^N G_N$, where $U_1^N$ is a length-N binary vector, $G_n$ is the nth Kronecker power of the 2×2 matrix $$G_1 = \begin{bmatrix} 1 & 0 \\ 1 & 1 \end{bmatrix}$$

and $X_1^N$ is the codeword which is then transmitted through the communication channel. It should be appreciated that varying the number of data bits in a polar codeword (of a fixed length) is easy. Various coding rates are achieved by setting the desired number of encoder inputs $U_i$ to data bits, and freezing the remaining bit values to a predetermined value, e.g., zeros. For example, to encode a rate ½ code, half of the $U_i$'s must be set to data bits, and the rest frozen to their predetermined value. The choice of which bit indices to freeze (and to what values) and which bits to use for data is fixed before transmission and revealed to both the transmitter and the receiver. Although the coding rate for polar codes and some other codes is easily varied, the codeword length is fixed to a small selection of values due to the way these codes are derived.

As noted above, the generator matrix of standard polar codes and some other error-correction codes (e.g., Reed-Muller codes) is derived from Kronecker powers of a 2×2 matrix. However, since the generator matrix of these codes is derived from Kronecker powers of a 2×2 matrix, these codes exist only for block lengths of $2^n$ for integer values of n. In other words, the codeword length is limited to only lengths of $2^n$ for integer values of n. This limits their applicability in communication systems where the frame structure may require lengths outside this small set of lengths, or may require flexibility in coding length depending on external conditions such as modulation levels, number of resource blocks, and number of spatial streams.

For example, cellular wireless networks (such as 3GPP networks) use various codeword lengths to support rate matching (e.g., permutation and bit selection). To accommodate support of flexible coding lengths, cellular wireless networks have traditionally used lower efficiency (i.e., capacity approaching) error-correcting codes (e.g., low-density parity-check (LDPC) codes, turbo codes, etc.) that support flexible coding lengths rather than the higher efficiency (i.e., capacity achieving) error-correcting codes that, as of yet, have not supported flexible coding lengths. Accordingly, it would be beneficial to enable capacity achieving error-correcting codes (e.g., polar codes) to have flexible code lengths so that they could be used in a wider array of applications.

The present systems and methods describe how to vary the codeword length. In particular, the present systems and methods describe a shortening method that is particular to polar codes (and all other codes that are derived from the Kronecker product matrix mentioned above, including Reed-Muller codes) that allows for a high degree of granularity in codeword length selection.

Turning now to the Figures, FIG. 1 illustrates an example of an environment 100 in which the present systems and methods may be implemented. The environment 100 includes multiple eNBs 110. In one example, each of the multiple eNBs 110 may be part of the same E-UTRAN. In another example, at least one of the eNBs 110 is associated with a different RAN (e.g., a different E-UTRAN). One or more UEs 105 may be within the coverage area of an eNB 110 and may communicate with the eNB 110 via a cellular air interface 120 (such as an LTE/LTE-Advanced access link).

The cellular air interface 120 may enable downlink communication (e.g., communication from the eNB 110 to the UE 105) and uplink communication (e.g., communication from the UE 105 to the eNB 110). In either downlink or uplink communication, the transmitting device encodes the data for transmission via the cellular air interface 120. The signal received by the receiving device may be noisy and/or corrupted as a result of transmission via the cellular air interface 120. The receiving device decodes the received signal with the hope that the error-correcting coding enables the data to be recreated from the decoded signal.

Due to the channel constraints of the cellular air interface 120 and/or the desire to match the highest supportable rates with the current channel conditions, it is desirable to utilize flexible codeword lengths. Both the eNB 110 and the UE 105 may support shortening of fixed length codewords to realize flexible codeword lengths and thus flexible rate matching.

Figure 2:
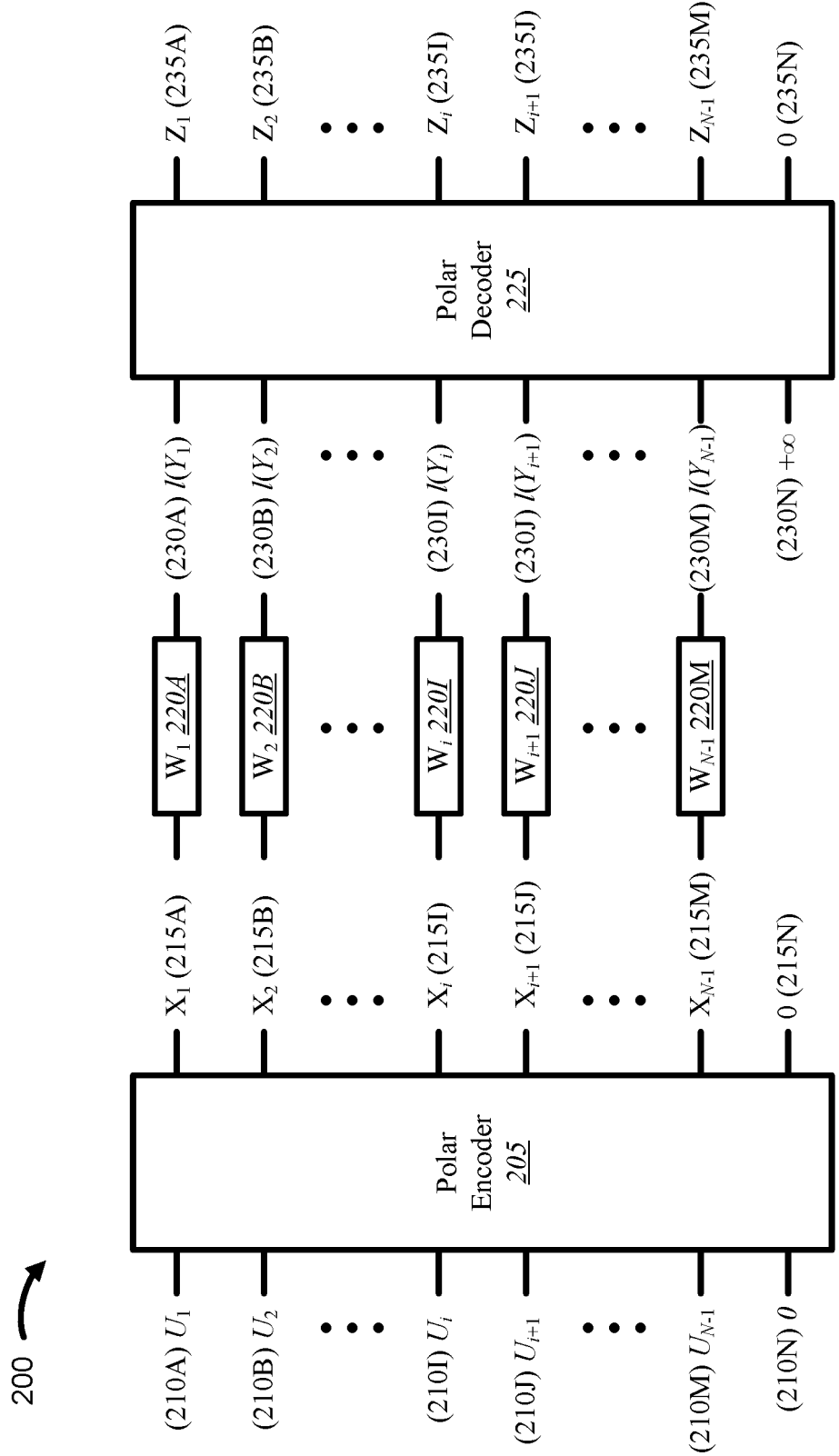
FIG. 2 is a block diagram illustrating one example of polar encoder and a polar decoder that support shortened polar codes.

FIG. 2 is a block diagram 200 illustrating one example of a polar encoder 205 and a polar decoder 225 that support shortened polar codes. The polar encoder 205 is an N length encoder having N inputs 210A-N and N outputs 215A-N. Similarly, the polar decoder 225 is an N length decoder having N inputs 230A-N and N outputs 235A-N.

As noted previously, the polar encoder 205 computes $X_1^N = U_1^N G_N$, where $U_1^N$ is a length-N binary vector, $G_n$ is the nth Kronecker power of the 2×2 matrix $$G_1 = \begin{bmatrix} 1 & 0 \\ 1 & 1 \end{bmatrix}$$

and $X_1^N$ is the typical (length N) codeword which is then transmitted through the communication channel $W_1^N$ 220A-N. Since the generator matrix of standard polar codes is derived from Kronecker powers of a 2×2 matrix, polar codes only exist for block lengths of $2^n$ for integer values of n. Therefore the length N of the polar encoder 205 is limited to lengths of $2^n$ for integer values of n. Similarly, the length N of the polar decoder 225 is limited to lengths of $2^n$ for integer values of n. In other words, the N for both the polar encoder 205 and the polar decoder 225 may be 2, 4, 8, 16, 32, 64, 128, 256, 512, 1024, or 2048, etc.

In some embodiments, a desired codeword length may be determined. In one example, the desired codeword length is determined based on channel quality information (CQI) (e.g., CQI determined at the UE 105, CQI reported to the eNB 110). In another example, the desired codeword length is determined based on downlink channel conditions and/or uplink channel conditions. Additionally, a desired code rate is determined. In some cases, the desired code rate is determined in connection with the desired codeword length (through CQI and/or channel conditions, for example).

As noted previously, various coding rates are achieved by setting the desired number of encoder inputs $U_i$ to data bits, and freezing the remaining bit values to a predetermined value, e.g. zeros. Therefore, for typical polar coding/decoding some bit indices are identified as data bits and the remaining bit indices are identified as frozen bits. In embodiments where polar codes are shortened, a third bit index type may also be to identify the shortened bit index/indices. Therefore, in addition to the standard "frozen" and "data" bit index types, a third bit index type "shortened" is also used.

If S represents a number of bits that should be shortened (e.g., shortened bits), then for a standard polar code of length N, the desired codeword length equals N−S. In one example, the S bits are selected (i.e., labeled) based on a pre-defined rule.

In order to transmit at rate R and at codeword length N−S, the polar encoder 205 places data at the ⌈R(N−S)⌉ bits $U_i$ out of the N−S bits that are not labeled shortened. To encode, the polar encoder 205 sets all frozen and shortened bits to a pre-determined value (all zeros, for example), and then computes $X_1^N$.

In one embodiment, the desired codeword length is N−1. Therefore, for an N length polar encoder 205, one bit needs to be shortened. In one example, the last bit index N (associated with input $U_N$ 210N and output $X_N$ 215N) is selected to be the shortened bit. With the shortened bit(s) selected (input bit $U_N$ 210N, bit index N, in this case), data can be applied to a subset of the remaining N−S bit inputs according to the desired coding rate with the remaining bits being frozen. For clarity, the distribution of data input bits $U_i$ to frozen inputs bits $U_i$ is not shown. The shortened bit(s)

(input bit $U_N$ 210N, bit index N, in this case) is set to a predetermined value (e.g., 0), and the N input bits $U_1$-$U_N$ 210A-210N are encoded by the polar encoder 205 (according to traditional methods, for example). Accordingly, the polar encoder 205 outputs N output bits $X_1$-$X_N$ 215A-215N.

Upon computing $X_1^N$ (i.e., all of the $X_i$'s 215A-N), the transmitter transmits only N−S of those $X_i$'s. In particular, the transmitter transmits only those $X_i$'s for which the bit index i is not labeled "shortened." For example, in the case where S=1 and the last bit index is shortened, then $X_1$-$X_{N-1}$ 215A-M are the only $X_i$'s that are transmitted through the communications channels $W_1$-$W_{N-1}$ 220A-220M. As discussed in further detail below, shortened bit indices are chosen such that they appear both at the input of the encoder (as $U_i$'s) and at the output of the encoder as codeword bits (as $X_i$'s). This guarantees that even though the shortened $X_i$'s are never transmitted, the corresponding $U_i$'s can still be decoded, and that they do not interfere with the decoding of other $U_i$'s. An example of this is shown in FIG. 2, where S=1 and the last codeword bit $X_N$ (215N)=$U_N$ (210N) is shortened and not sent through the channel. That is, the codeword length is N−1.

Since one or more bit indices need to be selected/labeled as shortened, the present systems and methods further describe how the bits are labeled "shortened," "frozen," and "data" for given values of rate R, shortening length S, and the length N of the mother code. In some embodiments, the number of bits to be shortened S is determined first, where S represents the number of bits to be shortened. The remaining N−S bits are then determined to be data or frozen bits, where the number of data bits is selected to achieve the data rate R. In some embodiments, the bits (i.e., bit indices) are selected based on the calculating error probabilities for each bit. In one example, the encoder has a pre-computed list of indices that orders bit indices from best to worst. For example, the ordering can be done by calculating error probabilities for each bit.

If $A \subseteq \{0,1\}^N$ denote the set of indices to be shortened, and if $U_A$ are the values of shortened bits, then the encoder may pick as A any set for which $X_A = f(U_A)$ for some deterministic function f: $\{0,1\}^S \rightarrow \{0,1\}^S$. In other words, A may be any set for which the corresponding code bits $X_A$ (which are not transmitted) are only a function of $U_A$.

For any given shortening length, there may be many sets A that adhere to the above rule. Two examples of rules that may be used are provided below with respect to FIGS. 3, 4, and FIGS. 5, 6. However, it is appreciated that many other rules are possible, including the rules created by taking mixtures of different rules (e.g., rules created by taking mixtures of the two rules discussed below).

Figure 3:
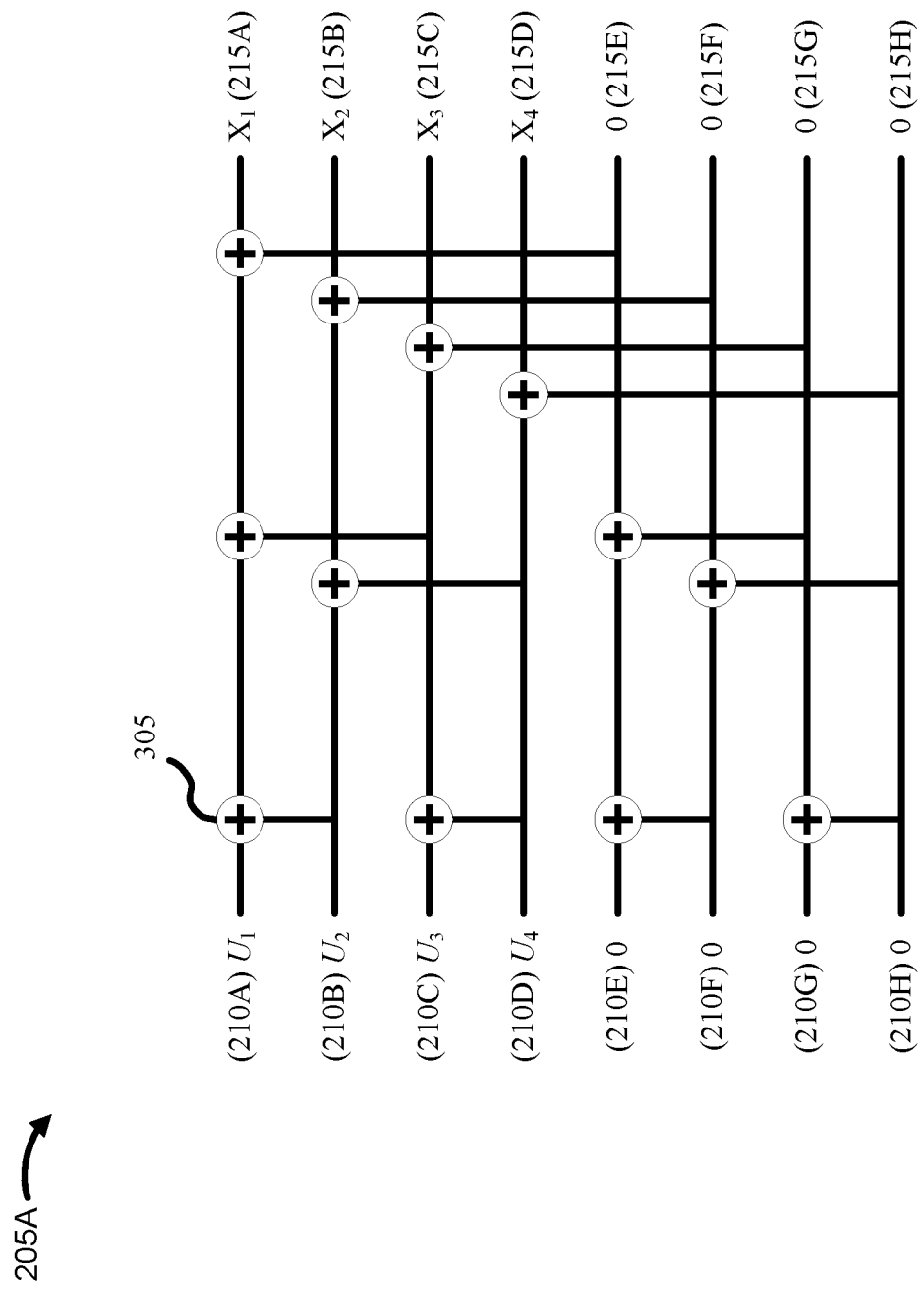
FIG. 3 illustrates one example of an encoder that adheres to a first rule.

FIG. 3 illustrates one example of an encoder 205A that adheres to a first rule. The encoder 205A may be one example of the polar encoder 205 illustrated in FIG. 2. The encoder 205A may be a polar encoder. For example, the encoder 205A may be a standard polar encoder of length N. The encoder 205A may operate on the various inputs via one or more operators 305. In one example, each operator 305 may be an exclusive OR (XOR) as illustrated in FIG. 3. In alternative embodiments, alternative operators may be used. For example, the operator 305 may be a sum operation, a modulo operation, etc. As noted previously, the encoder 205A outputs $X_i$'s 215A-215H based on the inputs $U_i$'s 210A-210H.

Given that an arbitrary bit permutation $\pi$: $\{0,1\}^n \rightarrow \{0,1\}^n$ may be fixed on n-bit numbers, for any given shortening length S, the first rule shortens all bit indices i that satisfy $\pi((i-1)_2) > N-S$, where $(i-1)_2$ is the binary expansion of i−1.

For example, if $\pi$ is the identity permutation, then the bits N−S+1, N−S+2, . . . , N−1, N are shortened. An example of this is shown in FIG. 3, where N=8, S=4, and bits $X_5$ (215E), $X_6$ (215F), $X_7$ (215G), $X_8$ (215H) are shortened.

In one example, the input $U_i$ for each shortened bit may be set to a predetermined value. For example, $U_5$ (210E), $U_6$ (210F), $U_7$ (210G), $U_8$ (210H) may be set to zero as illustrated in FIG. 3.

Figure 4:
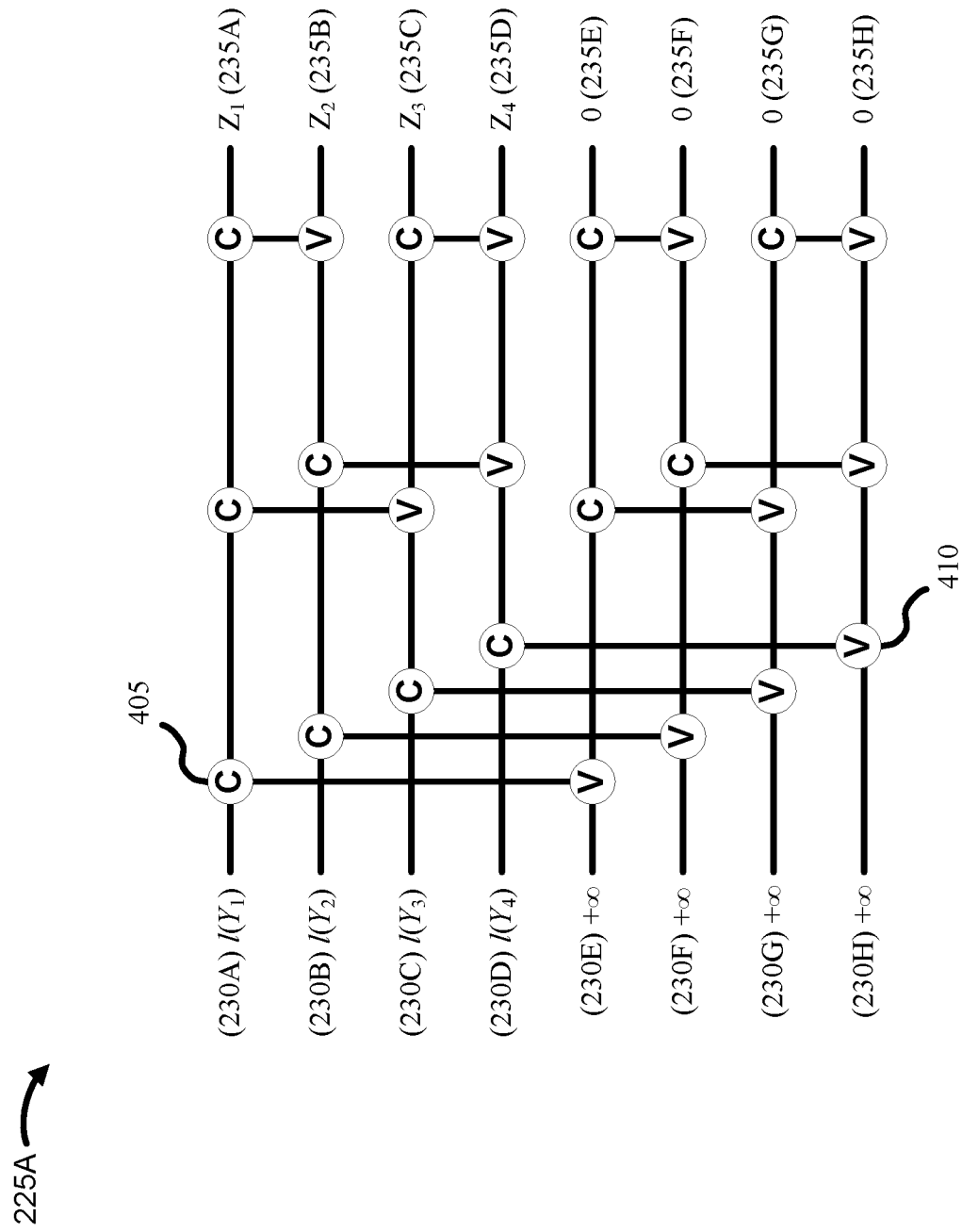
FIG. 4 illustrates one example of a decoder that adheres to a first rule.

FIG. 4 illustrates one example of a decoder 225A that adheres to a first rule. The decoder 225A may be one example of the polar decoder 225 illustrated in FIG. 2. The decoder 225A may be a polar decoder. For example, the decoder 225A may be a standard polar decoder of length N. The decoder 225A may operate on the various inputs $l(Y_i)$'s 230A-230H via one or more first operators 405 and/or one or more second operators 410. In one example, each first operator 405 (i.e., top end connection point operator 405) may be a check node operator or a minimum operator. In one example, each second operator 410 (i.e., bottom end connection point operator 410) may be a variable node operator or a sum operator. In alternative embodiments, alternative operators 405, 410 may be used. As noted previously, the decoder 225A may output $Z_i$'s 235A-235H based on the inputs $l(Y_i)$'s 230A-230H.

It is appreciated that any soft decoder (i.e., any decoder that uses channel likelihood-ratios as its input) for a length N polar code can be used to decode a code of length N−S. Upon receiving/obtaining channel outputs $Y_1^N$, the decoder 225A initializes the likelihood-ratios of shortened bits to either −∞ if the corresponding shortened code bit was 1, or to +∞ if the corresponding bit was set to 0. Instead of infinities, the decoder 225A may also use very large finite numbers to avoid overflows. As noted previously, the shortened code bits are independent of the data and are never transmitted through the channel. Un-shortened bit likelihood-ratios are initialized as $l(Y_i) = Pr[X_i=0|Y_i]/[X_i=1|Y_i]$. After this initialization, the decoder 225A then decodes in its usual fashion, as if it were decoding a length N code. After decoding, it discards the values of the decoded shortened bits $Z_i$. It is noted that the encoding and decoding procedures described herein use the same circuitry as those for the mother code but encode and decode codes of varying lengths.

In one example, the likelihood bit input $l(Y_i)$ for each shortened bit may be set to a predetermined value. For example, $l(Y_5)$ (230E), $l(Y_6)$ (230F), $l(Y_7)$ (230G), $l(Y_8)$ (230H) may be set to infinity (e.g., a very large positive number or a very large negative number) as illustrated in FIG. 4.

Figure 5:
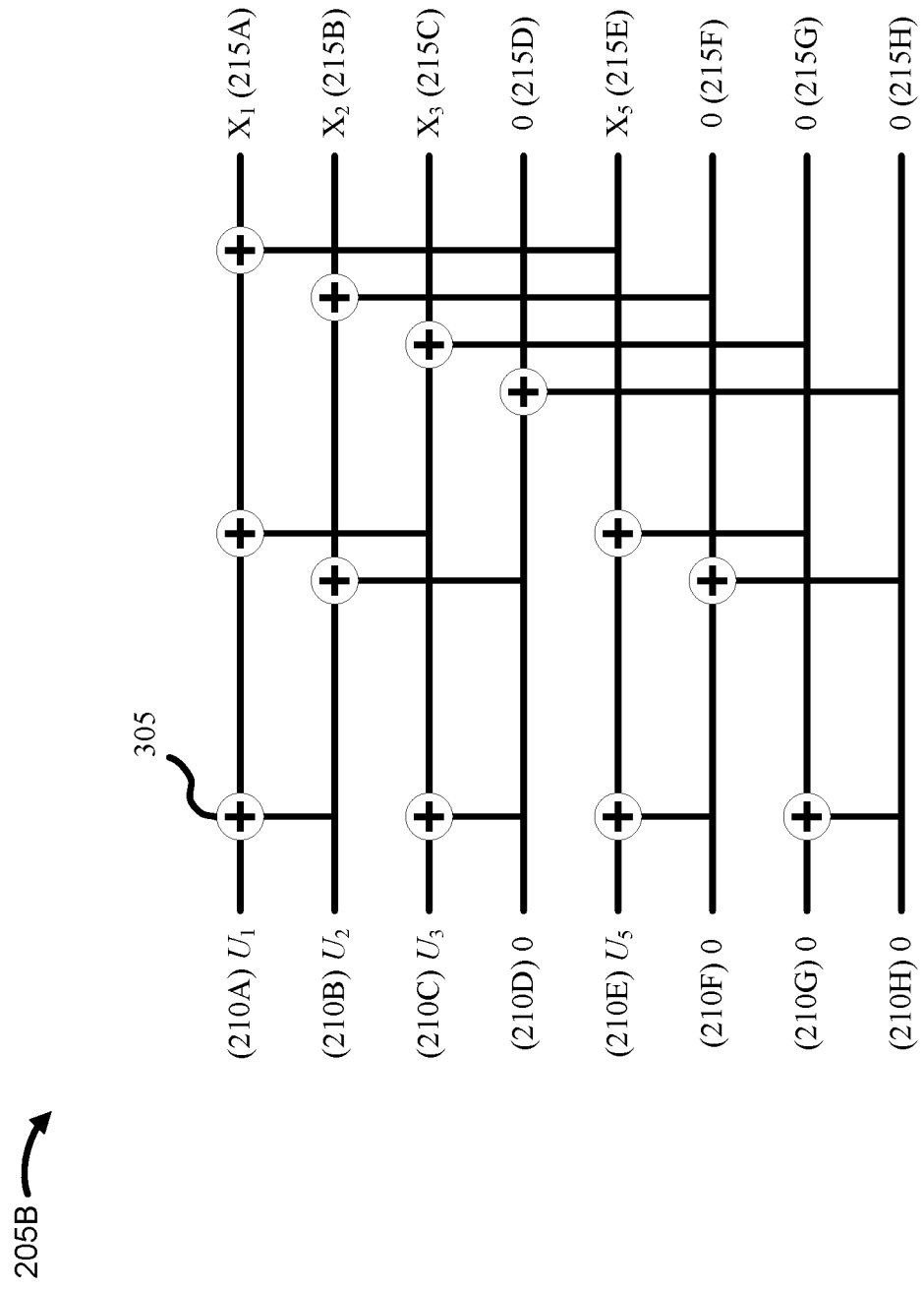
FIG. 5 illustrates one example of an encoder that adheres to a second rule.

FIG. 5 illustrates one example of an encoder 205B that adheres to a second rule. The encoder 205B may be one example of the polar encoder 205 illustrated in FIG. 2. The encoder 205B may be a polar encoder. For example, the encoder 205B may be a standard polar encoder of length N. The encoder 205B may operate on the various inputs via one or more operators 305. In one example, each operator 305 may be an exclusive OR (XOR) as illustrated in FIG. 5. In alternative embodiments, alternative operators may be used. For example, the operator 305 may be a sum operation, a modulo operation, etc. As noted previously, the encoder 205B outputs $X_i$'s 215A-215H based on the inputs $U_i$'s 210A-210H.

In the second rule, the K that satisfies $$\binom{N}{K} \leq S \leq \binom{N}{K+1}$$

is determined (e.g., where $$\binom{N}{K}$$

means N\ choose K operators, and $$\binom{N}{K+1}$$

means N\ choose K+1 operators). Once K has been determined, the second rule shortens all bits i for which the Hamming weight of $(i-1)_2$ is at most K. The second rule then may pick the remaining $$S - \binom{N}{K}$$

shortened bits arbitrarily from the set of indices for which the Hamming weight of $(i-1)_2$ is K+1. For example, the second rule picks the largest such indices i. An example of this is shown in FIG. 5, where N=8 and S=4 and bits $X_4$ (215D), $X_6$ (215F), $X_7$ (215G), $X_8$ (215H) are shortened.

In one example, the input $U_i$ for each shortened bit may be set to a predetermined value. For example, $U_4$ (210D), $U_6$ (210F), $U_7$ (210G), $U_8$ (210H) may be set to zero as illustrated in FIG. 5.

Figure 6:
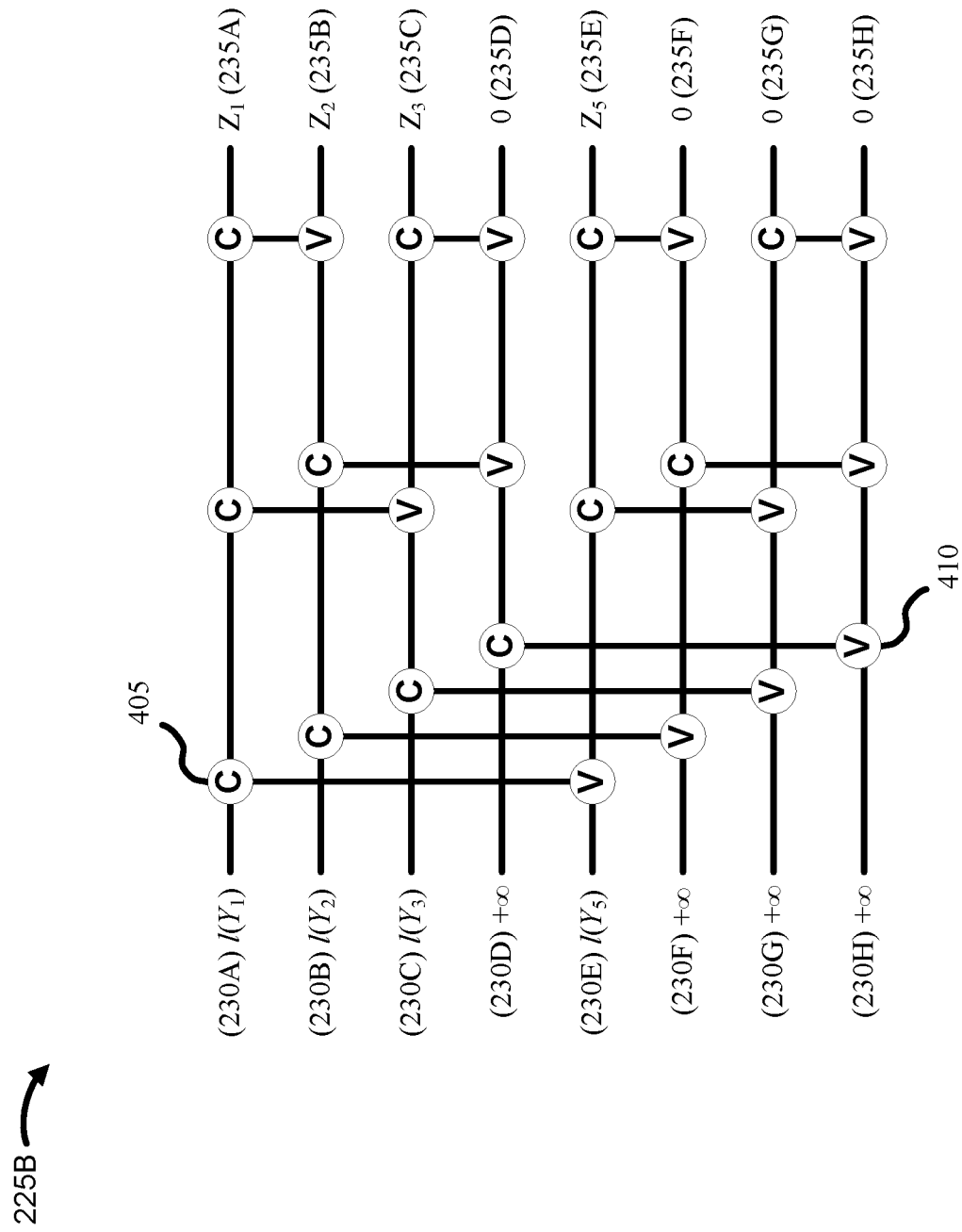
FIG. 6 illustrates one example of a decoder that adheres to a second rule.

FIG. 6 illustrates one example of a decoder 225B that adheres to a second rule. The decoder 225B may be one example of the polar decoder 225 illustrated in FIG. 2. The decoder 225B may be a polar decoder. For example, the decoder 225B may be a standard polar decoder of length N. The decoder 225A may operate on the various inputs $l(Y_i)$'s 230A-230H via one or more first operators 405 and/or one or more second operators 410. In one example, each first operator 405 (i.e., top end connection point operator 405) may be a check node operator or a minimum operator. In one example, each second operator 410 (i.e., bottom end connection point operator 410) may be a variable node operator or a sum operator. In alternative embodiments, alternative operators 405, 410 may be used. As noted previously, the decoder 225A may output $Z_i$'s 235A-235H based on the inputs $l(Y_i)$'s 230A-230H.

It is appreciated that any soft decoder (i.e., any decoder that uses channel likelihood-ratios as its input) for a length N polar code can be used to decode a code of length N–S. Upon receiving/obtaining channel outputs $Y_1^N$, the decoder 225B initializes the likelihood-ratios of shortened bits to either $-\infty$ if the corresponding shortened code bit was 1, or to $+\infty$ if the corresponding bit was set to 0. Instead of infinities, the decoder 225B may also use very large finite numbers to avoid overflows. As noted previously, the shortened code bits are independent of the data and are never transmitted through the channel. Un-shortened bit likelihood-ratios are initialized as $l(Y_i)=Pr[X_i=0|Y_i]/[X_i=1|Y_i]$. After this initialization, the decoder 225B then decodes in its usual fashion, as if it were decoding a length N code. After decoding, it discards the values of the decoded shortened bits $Z_i$. It is noted that the encoding and decoding procedures described herein use the same circuitry as those for the mother code but encode and decode codes of varying lengths.

In one example, the likelihood bit input $l(Y_i)$ for each shortened bit may be set to a predetermined value. For example, $l(Y_4)$ (230D), $l(Y_6)$ (230F), $l(Y_7)$ (230G), $l(Y_8)$ (230H) may be set to infinity (e.g., a very large positive number or a very large negative number) as illustrated in FIG. 6.

The table below (i.e., Table 1) shows the frame error rates (FER) of shortened codes at various rates and under different decoders. Here as above, S is the shortening length. Table 1 is generated using shortening rule 1 (the first rule described above) with the identity permutation for the experiments. That is, the last S bits are always shortened. In Table 1, the SC columns correspond to the successive cancellation decoder, and the List-16 columns are for the list decoder with list size 16. As can be appreciated from results in Table 1, there is almost no loss in FER performance as shortening length increases.

TABLE 1

| | Rate = ½, SNR = 1.5 dB | | Rate = ⅓, SNR = 0.75 dB | | Rate = ¾, SNR = 4.5 dB | |
|---|---|---|---|---|---|---|
| S | FER(SC) | FER(List-16) | FER(SC) | FER(List-16) | FER(SC) | FER(List-16) |
| 0 | 3.50E−01 | 3.00E−02 | 3.50E−01 | 2.20E−02 | 3.30E−01 | 2.10E−02 |
| 4 | 3.30E−01 | 2.80E−02 | 3.40E−01 | 1.70E−02 | 3.00E−01 | 1.80E−02 |
| 8 | 3.10E−01 | 3.00E−02 | 3.50E−01 | 2.00E−02 | 3.30E−01 | 2.90E−02 |
| 12 | 3.40E−01 | 3.20E−02 | 3.20E−01 | 2.20E−02 | 3.40E−01 | 2.80E−02 |
| 16 | 3.40E−01 | 3.30E−02 | 3.10E−01 | 1.90E−02 | 3.30E−01 | 2.20E−02 |
| 20 | 3.30E−01 | 3.30E−02 | 3.60E−01 | 2.10E−02 | 3.20E−01 | 2.40E−02 |
| 24 | 3.20E−01 | 3.90E−02 | 3.20E−01 | 2.10E−02 | 3.50E−01 | 1.90E−02 |
| 28 | 3.10E−01 | 4.00E−02 | 3.60E−01 | 2.00E−02 | 3.40E−01 | 2.60E−02 |
| 32 | 3.50E−01 | 3.50E−02 | 3.50E−01 | 2.40E−02 | 3.50E−01 | 2.00E−02 |
| 36 | 3.30E−01 | 4.00E−02 | 4.10E−01 | 2.20E−02 | 3.10E−01 | 2.60E−02 |
| 40 | 3.10E−01 | 3.20E−02 | 3.60E−01 | 2.10E−02 | 3.50E−01 | 2.70E−02 |
| 44 | 3.10E−01 | 3.30E−02 | 3.90E−01 | 1.50E−01 | 3.20E−01 | 2.50E−02 |
| 48 | 3.00E−01 | 3.40E−02 | 3.60E−01 | 1.90E−02 | 3.40E−01 | 2.30E−02 |
| 52 | 3.20E−01 | 3.60E−02 | 3.60E−01 | 2.20E−02 | 3.60E−01 | 2.20E−02 |
| 56 | 3.30E−01 | 3.20E−02 | 3.70E−01 | 1.70E−02 | 3.30E−01 | 2.40E−02 |
| 60 | 3.10E−01 | 3.20E−02 | 3.40E−01 | 2.10E−02 | 3.50E−01 | 2.40E−02 |
| 64 | 3.10E−01 | 3.70E−02 | 3.70E−01 | 1.90E−02 | 3.00E−01 | 2.60E−02 |

Figure 7:
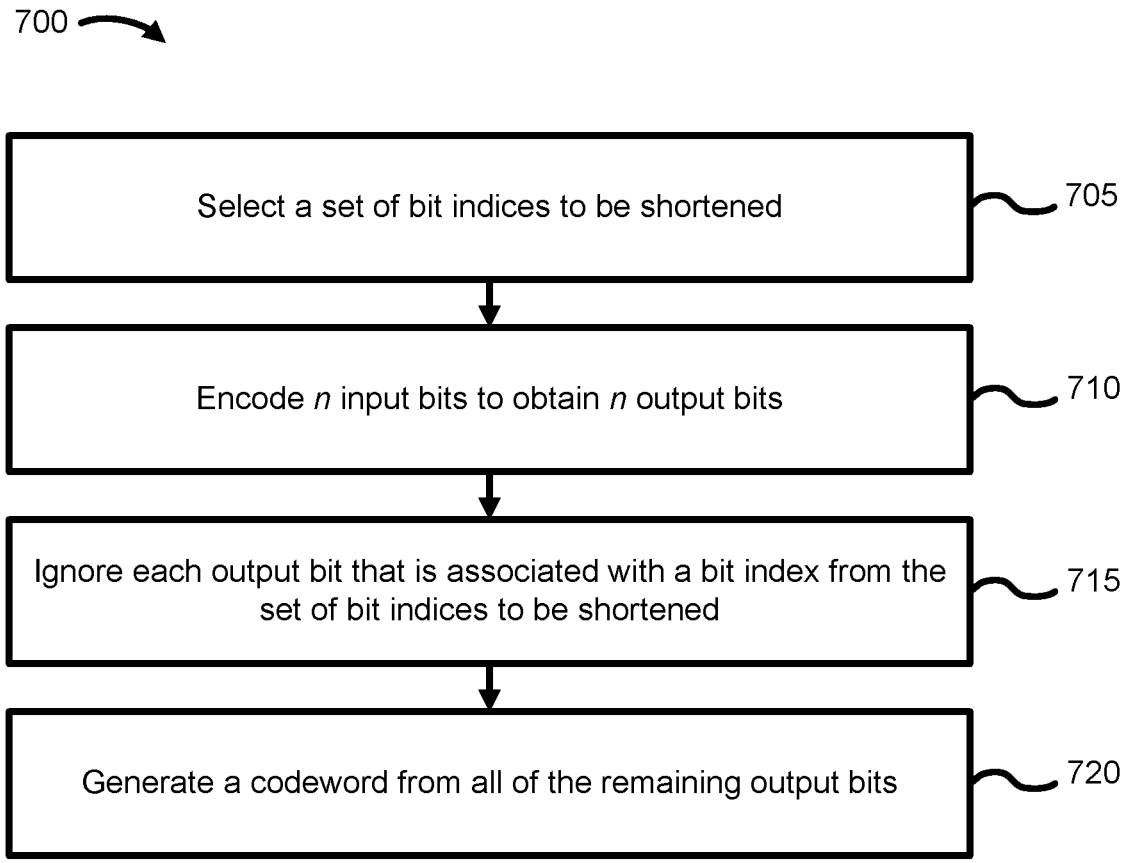
FIG. 7 is a flow diagram of a method for wireless communication.

FIG. 7 is a flow diagram of a method 700 for wireless communication. The method 700 may be performed by the encoder 205 illustrated in FIG. 2. Although the operations of the method 700 are illustrated as being performed in a particular order, it is understood that the operations of the method 700 may be reordered without departing from the scope of the method 700.

At 705, a set of bit indices are selected to be shortened. At 710, n input bits are encoded to obtain n output bits. At 715, each output bit that is associated with a bit index from the set of bit indices to be shortened is ignored. At 720, a codeword is generated from all of the remaining output bits.

The operations of the method 700 may be performed by an application specific processor, a programmable application specific integrated circuit (ASIC), a field programmable gate array (FPGA), or the like.

Figure 8:
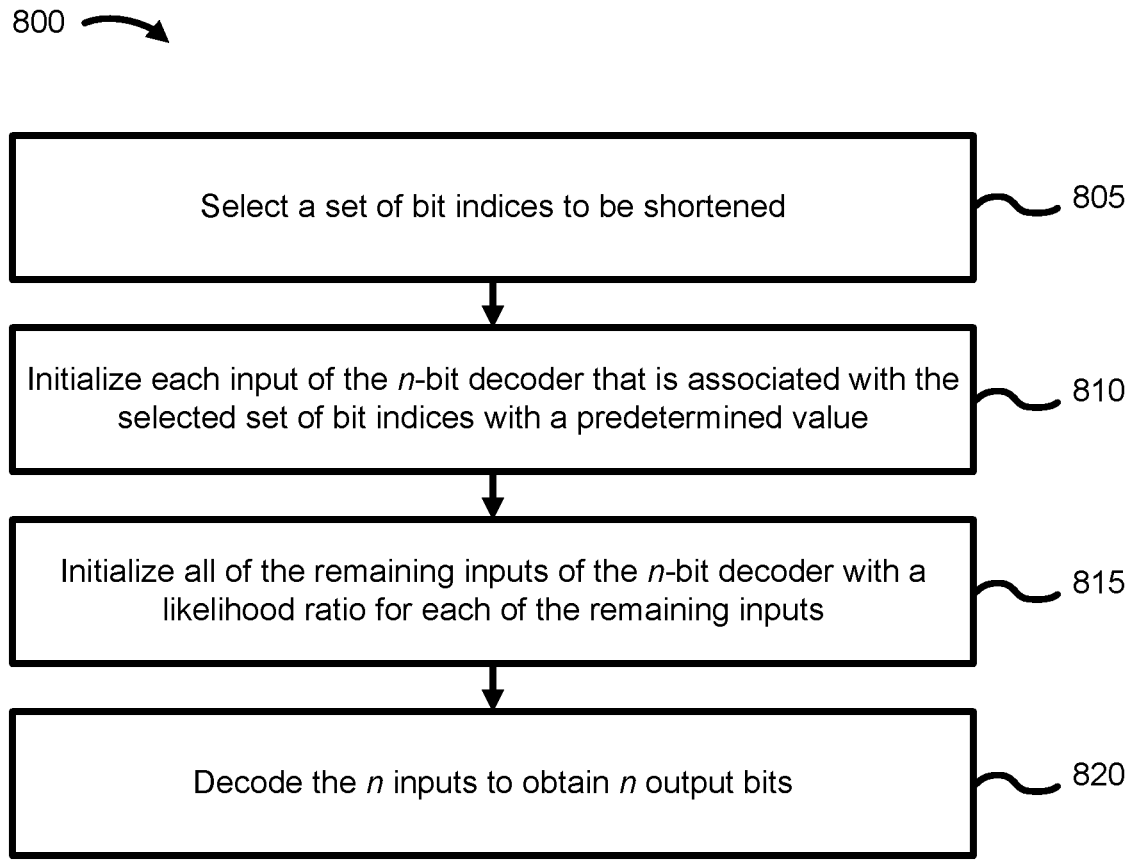
FIG. 8 is a flow diagram of a method for wireless communication.

FIG. 8 is a flow diagram of a method 800 for wireless communication. The method 800 is performed by the decoder 225 illustrated in FIG. 2. Although the operations of the method 800 are illustrated as being performed in a particular order, it is understood that the operations of the method 800 may be reordered without departing from the scope of the method 800.

At 805, a set of bit indices are selected to be shortened. At 810, each input of the n-bit decoder that is associated with the selected set of bit indices is initialized with a predetermined value. At 815, all of the remaining input bits of the n-bit decoder are initialized with a likelihood-ratio for each of the remaining inputs. At 820, the n inputs bits are decoded to obtain n output bits.

The operations of the method 800 may be performed by an application specific processor, a programmable application specific integrated circuit (ASIC), a field programmable gate array (FPGA), or the like.

Figure 9:
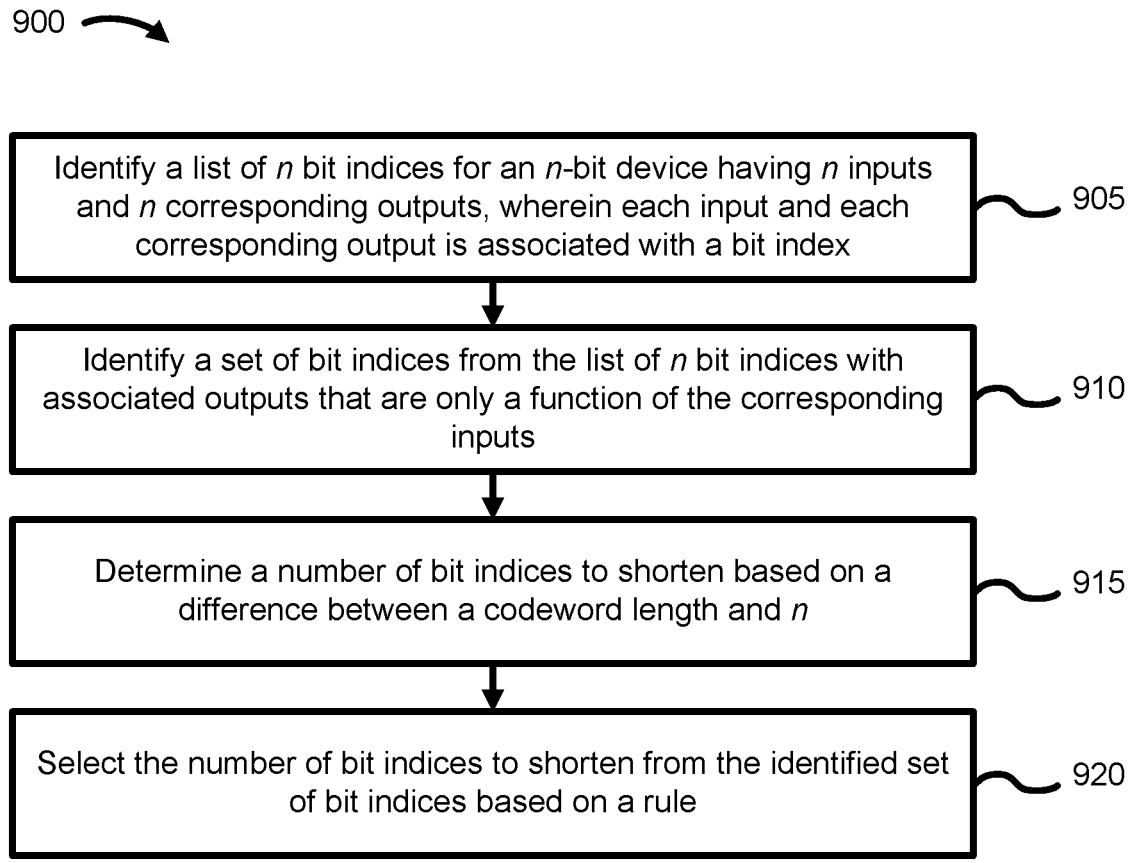
FIG. 9 is a flow diagram of a method for wireless communication.

FIG. 9 is a flow diagram of a method 900 for wireless communication. The method 900 is performed by the encoder 205 and/or the decoder 225 illustrated in FIG. 2. Although the operations of the method 900 are illustrated as being performed in a particular order, it is understood that the operations of the method 900 may be reordered without departing from the scope of the method 900.

At 905, a list of n-bit indices are identified for an n-bit device having n inputs and n corresponding outputs. Each input and each corresponding output is associated with a bit index. At 910, a set of bit indices from the list of n-bit indices with associated outputs that are only a function of the corresponding inputs are identified. At 915, a number of bit indices to shorten are determined based on a difference between a codeword length and n. At 920, the number of bit indices to be shortened are selected from the identified set of bit indices based on a rule.

The operations of the method 900 may be performed by an application specific processor, a programmable application specific integrated circuit (ASIC), a field programmable gate array (FPGA), or the like.

Figure 10:
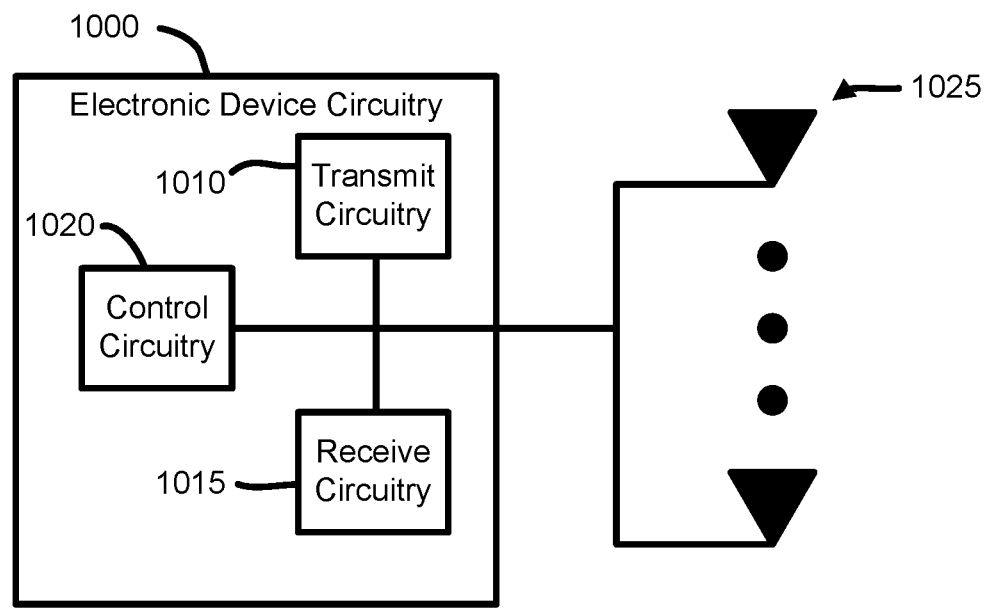
FIG. 10 is a block diagram illustrating electronic device circuitry that may be UE circuitry, network node circuitry, or some other type of circuitry in accordance with various embodiments.

FIG. 10 is a block diagram illustrating an electronic device circuitry 1000 that may be UE circuitry, network node circuitry, or some other type of circuitry in accordance with various embodiments. In embodiments, the electronic device circuitry 1000 may be, or may be incorporated into or otherwise a part of a UE, a mobile station (MS), a BTS, a network node, or some other type of electronic device. In embodiments, the electronic device circuitry 1000 may include a radio transmit circuitry 1010 and a receive circuitry 1015 coupled to a control circuitry 1020 (e.g., baseband processor(s)). In embodiments, the transmit circuitry 1010 and/or the receive circuitry 1015 may be elements or modules of transceiver circuitry, as shown. In some embodiments, the control circuitry 1020 can be in a device separate from the transmit circuitry 1010 and the receive circuitry 1015 (baseband processors shared by multiple antenna devices, as in cloud-RAN (C-RAN) implementations, for example). The electronic device circuitry 1000 may be coupled with one or more plurality of antenna elements 1025 of one or more antennas. The electronic device circuitry 1000 and/or the components of the electronic device circuitry 1000 may be configured to perform operations similar to those described elsewhere in this disclosure.

In embodiments where the electronic device circuitry 1000 is or is incorporated into or otherwise part of a UE, the transmit circuitry 1010 can transmit the various described information (e.g., codeword, control information) to the eNB. The receive circuitry 1015 can receive the various described information (e.g., codeword, control information) from the eNB. In certain embodiments, the electronic device circuitry 1000 shown in FIG. 10 is operable to perform one or more methods, such as the methods shown in FIGS. 7-9.

Figure 11:
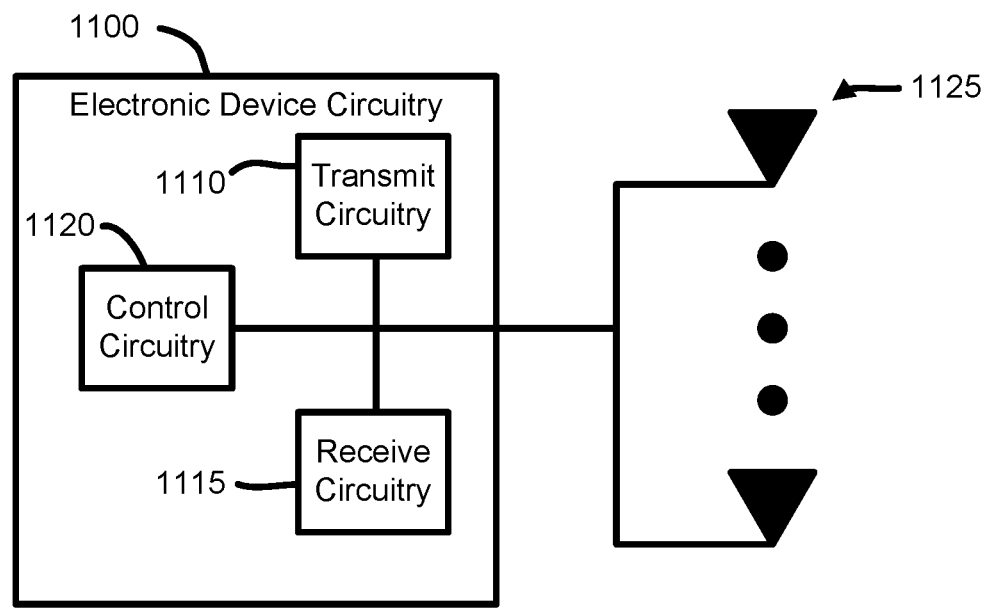
FIG. 11 is a block diagram illustrating electronic device circuitry that may be eNB circuitry, network node circuitry, or some other type of circuitry in accordance with various embodiments.

FIG. 11 is a block diagram illustrating an electronic device circuitry 1100 that may be eNB circuitry, network node circuitry, or some other type of circuitry in accordance with various embodiments. In embodiments, the electronic device circuitry 1100 may be, or may be incorporated into or otherwise a part of, an eNB, a BTS, a network node, or some other type of electronic device. In embodiments, the electronic device circuitry 1100 may include a radio transmit circuitry 1110 and a receive circuitry 1115 coupled to a control circuitry 1120 (e.g., baseband processor(s)). In embodiments, the transmit circuitry 1110 and/or the receive circuitry 1115 may be elements or modules of transceiver circuitry, as shown. In some embodiments, the control circuitry 1120 can be in a device separate from the transmit circuitry 1110 and the receive circuitry 1115 (baseband processors shared by multiple antenna devices, as in cloud-RAN (C-RAN) implementations, for example). The electronic device circuitry 1100 may be coupled with one or more plurality of antenna elements 1125 of one or more antennas. The electronic device circuitry 1100 and/or the components of the electronic device circuitry 1100 may be configured to perform operations similar to those described elsewhere in this disclosure.

In embodiments where the electronic device circuitry 1100 is an eNB, a BTS and/or a network node, or is incorporated into or is otherwise part of an eNB, a BTS and/or a network node, the transmit circuitry 1110 can transmit the various described information (e.g., codeword, control information) to the UE. The receive circuitry 1115 can receive the various described information (e.g., codeword, control information) from the UE. In certain embodiments, the electronic device circuitry 1100 shown in FIG. 11 is operable to perform one or more methods, such as the methods shown in FIGS. 7-9.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Figure 12:
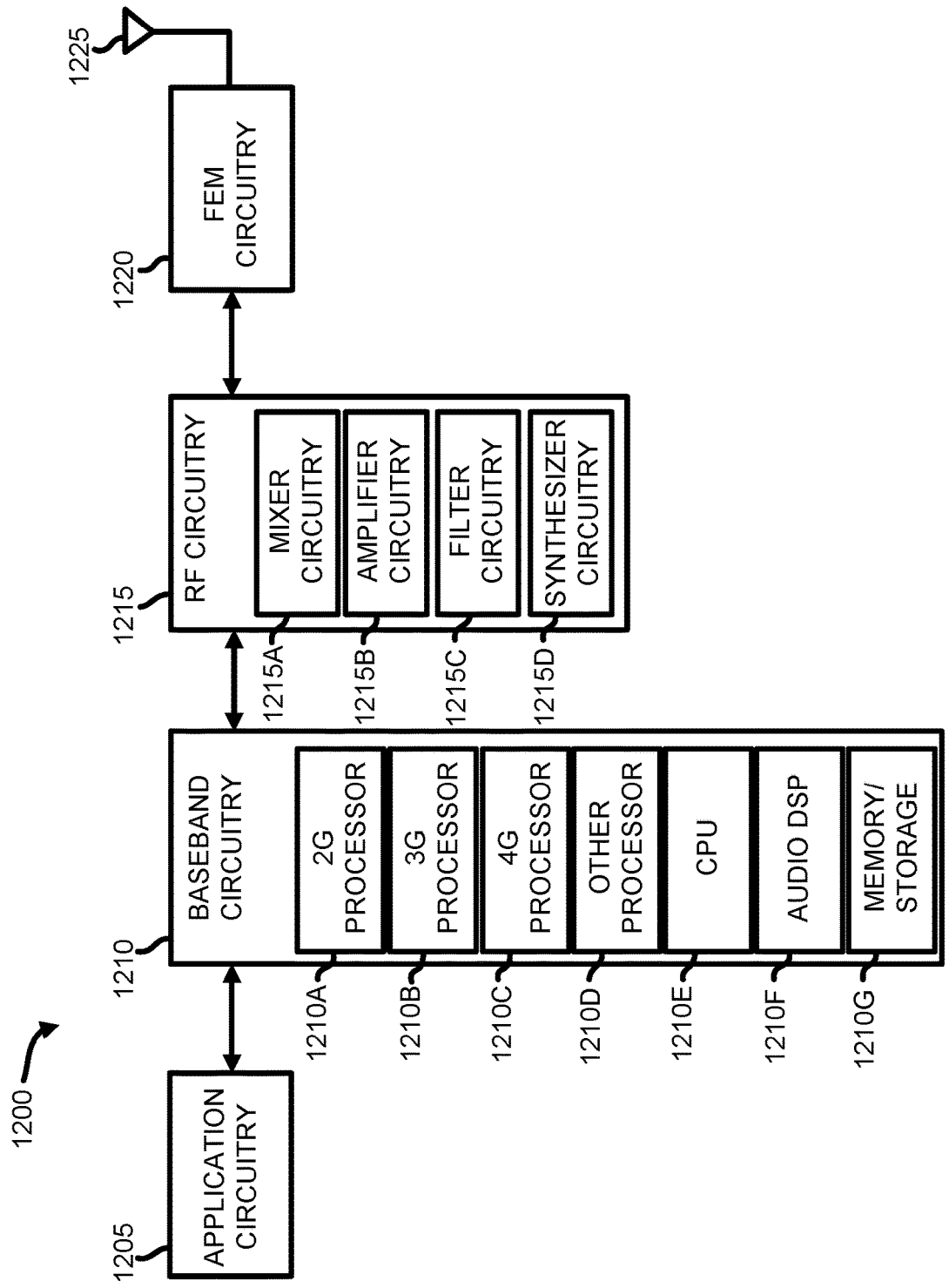
FIG. 12 is a block diagram illustrating, for one embodiment, example components of a user equipment (UE) or mobile station (MS) device.

Embodiments described herein may be implemented into a system using any suitably configured hardware and/or software. FIG. 12 is a block diagram illustrating, for one embodiment, example components of a user equipment (UE) or mobile station (MS) device 1200. In some embodiments, the UE device 1200 may include an application circuitry 1205, a baseband circuitry 1210, a Radio Frequency (RF) circuitry 1215, a front-end module (FEM) circuitry 1220, and one or more antennas 1225, coupled together at least as shown in FIG. 12.

The application circuitry 1205 may include one or more application processors. By way of non-limiting example, the application circuitry 1205 may include one or more single-core or multi-core processors. The processor(s) may include any combination of general-purpose processors and dedicated processors (e.g., graphics processors, application processors, etc.). The processor(s) may be operably coupled and/or include memory/storage, and may be configured to execute instructions stored in the memory/storage to enable various applications and/or operating systems to run on the system.

By way of non-limiting example, the baseband circuitry 1210 may include one or more single-core or multi-core processors. The baseband circuitry 1210 may include one or more baseband processors and/or control logic. The baseband circuitry 1210 may be configured to process baseband signals received from a receive signal path of the RF circuitry 1215. The baseband circuitry 1210 may also be configured to generate baseband signals for a transmit signal path of the RF circuitry 1215. The baseband circuitry 1210 may interface with the application circuitry 1205 for generation and processing of the baseband signals, and for controlling operations of the RF circuitry 1215.

By way of non-limiting example, the baseband circuitry 1210 may include at least one of a second generation (2G) baseband processor 1210A, a third generation (3G) baseband processor 1210B, a fourth generation (4G) baseband processor 1210C, other baseband processor(s) 1210D for other existing generations, and generations in development or to be developed in the future (e.g., fifth generation (5G), 6G, etc.). The baseband circuitry 1210 (e.g., at least one of baseband processors 1210A-1210D) may handle various radio control functions that enable communication with one or more radio networks via the RF circuitry 1215. By way of non-limiting example, the radio control functions may include signal modulation/demodulation, encoding/decoding, radio frequency shifting, other functions, and combinations thereof. In some embodiments, modulation/demodulation circuitry of the baseband circuitry 1210 may be programmed to perform Fast-Fourier Transform (FFT), precoding, constellation mapping/demapping functions, other functions, and combinations thereof. In some embodiments, encoding/decoding circuitry of the baseband circuitry 1210 may be programmed to perform convolutions, tail-biting convolutions, turbo, Viterbi, low-density parity-check (LDPC) encoder/decoder functions, other functions, and combinations thereof. Embodiments of modulation/demodulation and encoder/decoder functions are not limited to these examples, and may include other suitable functions.

In some embodiments, the baseband circuitry 1210 may include elements of a protocol stack. By way of non-limiting example, elements of an evolved universal terrestrial radio access network (E-UTRAN) protocol including, for example, physical (PHY), media access control (MAC), radio link control (RLC), packet data convergence protocol (PDCP), and/or radio resource control (RRC) elements. A central processing unit (CPU) 1210E of the baseband circuitry 1210 may be programmed to run elements of the protocol stack for signaling of the PHY, MAC, RLC, PDCP and/or RRC layers. In some embodiments, the baseband circuitry 1210 may include one or more audio digital signal processor(s) (DSP) 1210F. The audio DSP(s) 1210F may include elements for compression/decompression and echo cancellation. The audio DSP(s) 1210F may also include other suitable processing elements.

The baseband circuitry 1210 may further include memory/storage 1210G. The memory/storage 1210G may include data and/or instructions for operations performed by the processors of the baseband circuitry 1210 stored thereon. In some embodiments, the memory/storage 1210G may include any combination of suitable volatile memory and/or non-volatile memory. The memory/storage 1210G may also include any combination of various levels of memory/storage including, but not limited to, read-only memory (ROM) having embedded software instructions (e.g., firmware), random access memory (e.g., dynamic random access memory (DRAM)), cache, buffers, etc. In some embodiments, the memory/storage 1210G may be shared among the various processors or dedicated to particular processors.

Components of the baseband circuitry 1210 may be suitably combined in a single chip or a single chipset, or disposed on a same circuit board in some embodiments. In some embodiments, some or all of the constituent components of the baseband circuitry 1210 and the application circuitry 1205 may be implemented together, such as, for example, on a system on a chip (SoC).

In some embodiments, the baseband circuitry 1210 may provide for communication compatible with one or more radio technologies. For example, in some embodiments, the baseband circuitry 1210 may support communication with an evolved universal terrestrial radio access network (E-UTRAN) and/or other wireless metropolitan area networks (WMAN), a wireless local area network (WLAN), or a wireless personal area network (WPAN). Embodiments in which the baseband circuitry 1210 is configured to support radio communications of more than one wireless protocol may be referred to as multi-mode baseband circuitry.

The RF circuitry 1215 may enable communication with wireless networks using modulated electromagnetic radiation through a non-solid medium. In various embodiments, the RF circuitry 1215 may include switches, filters, amplifiers, etc. to facilitate the communication with the wireless network. The RF circuitry 1215 may include a receive signal path which may include circuitry to down-convert RF signals received from the FEM circuitry 1220, and provide baseband signals to the baseband circuitry 1210. The RF circuitry 1215 may also include a transmit signal path which may include circuitry to up-convert baseband signals provided by the baseband circuitry 1210, and provide RF output signals to the FEM circuitry 1220 for transmission.

In some embodiments, the RF circuitry 1215 may include a receive signal path and a transmit signal path. The receive signal path of the RF circuitry 1215 may include a mixer circuitry 1215A, an amplifier circuitry 1215B, and a filter circuitry 1215C. The transmit signal path of the RF circuitry 1215 may include the filter circuitry 1215C and the mixer circuitry 1215A. The RF circuitry 1215 may further include a synthesizer circuitry 1215D configured to synthesize a frequency for use by the mixer circuitry 1215A of the receive signal path and the transmit signal path. In some embodiments, the mixer circuitry 1215A of the receive signal path may be configured to down-convert RF signals received from the FEM circuitry 1220 based on the synthesized frequency provided by the synthesizer circuitry 1215D. The amplifier circuitry 1215B may be configured to amplify the down-converted signals.

The filter circuitry 1215C may include a low-pass filter (LPF) or band-pass filter (BPF) configured to remove unwanted signals from the down-converted signals to generate output baseband signals. Output baseband signals may be provided to the baseband circuitry 1210 for further processing. In some embodiments, the output baseband signals may include zero-frequency baseband signals, although this is not a requirement. In some embodiments, the mixer circuitry 1215A of the receive signal path may comprise passive mixers, although the scope of the embodiments is not limited in this respect.

In some embodiments, the mixer circuitry 1215A of the transmit signal path may be configured to up-convert input baseband signals based on the synthesized frequency provided by the synthesizer circuitry 1215D to generate RF output signals for the FEM circuitry 1220. The baseband signals may be provided by the baseband circuitry 1210 and may be filtered by the filter circuitry 1215C. The filter circuitry 1215C may include a low-pass filter (LPF), although the scope of the embodiments is not limited in this respect. In some embodiments, the mixer circuitry 1215A of the receive signal path and the mixer circuitry 1215A of the transmit signal path may include two or more mixers, and may be arranged for quadrature downconversion and/or upconversion, respectively. In some embodiments, the mixer circuitry 1215A of the receive signal path and the mixer circuitry 1215A of the transmit signal path may include two or more mixers and may be arranged for image rejection (e.g., Hartley image rejection). In some embodiments, the mixer circuitry 1215A of the receive signal path and the mixer circuitry 1215A of the transmit signal path may be arranged for direct downconversion and/or direct upconversion, respectively. In some embodiments, the mixer circuitry 1215A of the receive signal path and the mixer circuitry 1215A of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In such embodiments, the RF circuitry 1215 may include analog-to-digital converter (ADC) and digital-to-analog converter (DAC) circuitry, and the baseband circuitry 1210 may include a digital baseband interface to communicate with the RF circuitry 1215.

In some dual-mode embodiments, separate radio IC circuitry may be provided for processing signals for each spectrum, although the scope of the embodiments is not limited in this respect.

In some embodiments, the synthesizer circuitry 1215D may include one or more of a fractional-N synthesizer and a fractional N/N+1 synthesizer, although the scope of the embodiments is not limited in this respect as other types of frequency synthesizers may be suitable. For example, the synthesizer circuitry 1215D may include a delta-sigma synthesizer, a frequency multiplier, a synthesizer comprising a phase-locked loop with a frequency divider, other synthesizers, and combinations thereof.

The synthesizer circuitry 1215D may be configured to synthesize an output frequency for use by the mixer circuitry 1215A of the RF circuitry 1215 based on a frequency input and a divider control input. In some embodiments, the synthesizer circuitry 1215D may be a fractional N/N+1 synthesizer.

In some embodiments, frequency input may be provided by a voltage controlled oscillator (VCO), although that is not a requirement. Divider control input may be provided by either the baseband circuitry 1210 or the application circuitry 1205 depending on the desired output frequency. In some embodiments, a divider control input (e.g., N) may be determined from a look-up table based on a channel indicated by the application circuitry 1205.

The synthesizer circuitry 1215D of the RF circuitry 1215 may include a divider, a delay-locked loop (DLL), a multiplexer and a phase accumulator. In some embodiments, the divider may include a dual modulus divider (DMD), and the phase accumulator may include a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In such embodiments, the delay elements may be configured to break a VCO period up into Nd equal packets of phase, where Nd is the number of delay elements in the delay line. In this way, the DLL may provide negative feedback to help ensure that the total delay through the delay line is one VCO cycle.

In some embodiments, the synthesizer circuitry 1215D may be configured to generate a carrier frequency as the output frequency. In some embodiments, the output frequency may be a multiple of the carrier frequency (e.g., twice the carrier frequency, four times the carrier frequency, etc.) and used in conjunction with a quadrature generator and divider circuitry to generate multiple signals at the carrier frequency with multiple different phases with respect to each other. In some embodiments, the output frequency may be a LO frequency (fLO). In some embodiments, the RF circuitry 1215 may include an IQ/polar converter.

The FEM circuitry 1220 may include a receive signal path which may include circuitry configured to operate on RF signals received from one or more antennas 1225, amplify the received signals, and provide the amplified versions of the received signals to the RF circuitry 1215 for further processing. The FEM circuitry 1220 may also include a transmit signal path which may include circuitry configured to amplify signals for transmission provided by the RF circuitry 1215 for transmission by at least one of the one or more antennas 1225.

In some embodiments, the FEM circuitry 1220 may include a TX/RX switch configured to switch between a transmit mode and a receive mode operation. The FEM circuitry 1220 may include a receive signal path and a transmit signal path. The receive signal path of the FEM circuitry 1220 may include a low-noise amplifier (LNA) to amplify received RF signals and provide the amplified received RF signals as an output (e.g., to the RF circuitry 1215). The transmit signal path of the FEM circuitry 1220 may include a power amplifier (PA) configured to amplify input RF signals (e.g., provided by the RF circuitry 1215), and one or more filters configured to generate RF signals for subsequent transmission (e.g., by one or more of the one or more antennas 1225).

In some embodiments, the UE device 1200 may include additional elements such as, for example, memory/storage, a display, a camera, one of more sensors, an input/output (I/O) interface, other elements, and combinations thereof.

In some embodiments, the UE device 1200 may be configured to perform one or more processes, techniques, and/or methods as described herein, or portions thereof.

Examples

The following examples pertain to further embodiments.

Example 1 is an apparatus of a device for wireless communication in an evolved universal terrestrial radio access network (E-UTRAN). The apparatus includes an n-bit encoder having n inputs and n corresponding outputs, where each input and each corresponding output is associated with a bit index, and one or more processors. The one or more processors select a set of bit indices to be shortened, encode, via the n-bit encoder, n input bits to obtain n output bits, ignore output bits that are associated with a bit index from the set of bit indices to be shortened, and generate a codeword from the remaining output bits.

In Example 2, the apparatus of Example 1 or any of the Examples described herein to select a set of bit indices to be shortened can optionally identify one or more bit indices with associated outputs that are only a function of the corresponding inputs, where the set of bit indices to be shortened are selected from the identified one or more bit indices.

In Example 3, the apparatus of Examples 1 or 2, or any of the Examples described herein can optionally obtain control information, and determine a desired codeword length and a desired code rate based on the obtained control information.

In Example 4, the apparatus of Example 3 or any of the Examples described herein to select a set of bit indices to be shortened can optionally determine a number of bit indices to select based on a difference between the desired codeword length and the n output bits of the n-bit encoder, where a number of bit indices in the set of bit indices to be shortened equals the determined number of bit indices.

In Example 5, the apparatus of Example 3 or any of the Examples described herein can optionally determine an error probability for each of the n inputs, identify the set of bit indices to be shortened as shortened indices, identify a second subset of the bit indices as data indices based at least in part on the determined desired code rate and the determined error probability for each of the n inputs, and identify any remaining bit indices as frozen indices.

In Example 6, the apparatus of Example 5 or any of the Examples described herein can optionally set the inputs for the shortened indices and the frozen indices to be predetermined values, and set the inputs for the data indices using obtained data, where the set input values are encoded to obtain the n output bits.

In Example 7, the apparatus of Examples 1 or 2, or any of the Examples described herein to select a set of bit indices to be shortened can optionally select the set of bit indices to be shortened based on at least one rule.

Example 8 is the apparatus of Example 7 or any of the Examples described herein where the at least one rule comprises a first rule where the one or more processors are to select a number of last bit indices.

Example 9 is the apparatus of Example 7 or any of the Examples described herein where the at least one rule comprises a second rule where the one or more processors are to determine a Hamming weight for each of the bit indices, and select a number of bit indices based on the determined Hamming weight, where the bit indices with a largest Hamming weight are selected.

In Example 10, the apparatus of Example 1 or any of the Examples described herein can optionally include transmission circuitry for transmitting the generated codeword.

Example 11 is an apparatus of a device for wireless communication in an evolved universal terrestrial radio access network (E-UTRAN). The apparatus includes an n-bit decoder having n inputs and n corresponding outputs, where each input and each corresponding output is associated with a bit index, and one or more processors. The one or more processors select a set of bit indices to be shortened, initialize input bits of the n-bit decoder that are associated with the selected set of bit indices with a predetermined value, initialize the remaining input bits of the n-bit decoder with a likelihood ratio for each of the remaining input bits, and decode the n input bits to obtain n output bits.

In Example 12, the apparatus of Example 11 or any of the Examples described herein to select a set of bit indices to be shortened can optionally identify one or more of bit indices with associated outputs that are only a function of the corresponding input bits, wherein the set of bit indices to be shortened are selected from the identified one or more bit indices.

In Example 13, the apparatus of Example 11 or any of the Examples described herein can optionally obtain control information, and determine a codeword length and a code rate based on the obtained control information.

In Example 14, the apparatus of Example 13 or any of the Examples described herein to select a set of bit indices to be shortened can optionally determine a number of bit indices to select based on a difference between the determined codeword length and the n inputs of the n-bit decoder, where a number of bit indices in the set of bit indices to be shortened equals the determined number of bit indices.

In Example 15, the apparatus of Example 13 or any of the Examples described herein can optionally identify the set of bit indices to be shortened as shortened indices, identify a second subset of the bit indices as data indices based at least in part on the determined code rate and a determined error probability for each input bit of an encoder, and identify any remaining bit indices as frozen indices.

In Example 16, the apparatus of Example 15 or any of the Examples described herein can optionally discard each output bit that is associated with an identified shortened index, discard each output bit that is associated with an identified frozen index, and obtain transmitted data from each output bit that is associated with an identified data index.

In Example 17, the apparatus of any of Examples 11-16 or any of the Examples described herein to select a set of bit indices to be shortened can optionally select the set of bit indices to be shortened based on at least one rule.

Example 18 is the apparatus of Example 17 or any of the Examples described herein where the at least one rule comprises a first rule to select a number of last bit indices where the one or more processors are to select a number of last bit indices.

Example 19 the apparatus of Example 17 or any of the Examples described herein where the at least one rule comprises a second rule to determine a Hamming weight for each of the bit indices and select a number of bit indices based on the determined Hamming weight, wherein the bit indices with the largest Hamming weight are selected, where the one or more processors are to determine a Hamming weight for each of the bit indices, and select a number of bit indices based on the determined Hamming weight.

In Example 20, the apparatus of Example 11 or any of the Examples described herein can optionally include reception circuitry for receiving a transmitted codeword having the determined codeword length.

Example 21 is an apparatus of a device for wireless communication. The apparatus includes means for identifying a list of n bit indices for an n-bit device having n inputs and n corresponding outputs, where each input and each corresponding output is associated with a bit index, means for identifying a set of bit indices from the list of n bit indices with associated outputs that are only a function of the corresponding inputs, means for determining a number of bit indices to shorten based on a difference between a codeword length and n, and means for selecting the number of bit indices from the identified set of bit indices to be shortened based on at least one rule.

In Example 22, the apparatus of Example 21 or any of the Examples described herein can optionally include means for selecting a number of last bit indices, wherein the at least one rule comprises selecting a number of last bit indices.

In Example 23, the apparatus of Example 21 or any of the Examples described herein can optionally include means for determining a Hamming weight for each of the bit indices, and means for selecting a number of bit indices based on the determined Hamming weight, wherein the at least one rule comprises determine a Hamming weight for each of the bit indices, and selecting a number of bit indices based on the determined Hamming weight, wherein the bit indices with a largest Hamming weight are selected.

Example 24 is the device of Example 21 or any of the Examples described herein where the device is a polar encoder.

Example 25 is the device of Example 21 or any of the Examples described herein where the device is a polar decoder.

Example 26 is a method for wireless communication. The method includes electing a set of bit indices of an n-bit encoder to be shortened, the n-bit encoder having n inputs and n corresponding outputs, where each input and each corresponding output is associated with a bit index; encoding, via the n-bit encoder, n input bits to obtain n output bits, ignoring output bits that are associated with a bit index from the set of bit indices to be shortened, and generating a codeword from the remaining output bits.

In Example 27, the method of Example 26 or any of the Examples described herein for selecting a set of bit indices to be shortened further includes identifying one or more bit indices with associated outputs that are only a function of the corresponding inputs, wherein the set of bit indices to be shortened are selected from the identified one or more bit indices.

In Example 28, the method of Example 26 or any of the Examples described herein further include obtaining control information, and determining a desired codeword length and a desired code rate based on the obtained control information.

In Example 29, the method of Example 28 or any of the Examples described herein for selecting a set of bit indices to be shortened further includes determining a number of bit indices to select based on a difference between the desired codeword length and the n output bits of the n-bit encoder, where a number of bit indices in the set of bit indices to be shortened equals the determined number of bit indices.

In Example 30, the method of Example 28 or any of the Examples described herein further include determining an error probability for each of the n inputs, identifying the set of bit indices to be shortened as shortened indices, identifying a second subset of the bit indices as data indices based at least in part on the determined desired code rate and the determined error probability for each of the n inputs, and identifying any remaining bit indices as frozen indices.

In Example 31, the method of Example 30 or any of the Examples described herein further include setting the inputs for the shortened indices and the frozen indices to be predetermined values, and setting the inputs for the data indices using obtained data, where the set input values are encoded to obtain the n output bits.

In Example 32, the method of Example 26 or any of the Examples described herein for selecting a set of bit indices to be shortened further includes selecting the set of bit indices to be shortened based on at least one rule.

In Example 33, the method of Example 32 or any of the Examples described herein further include selecting a number of last bit indices, wherein the at least one rule comprises selecting a number of last bit indices.

In Example 34, the method of Example 32 or any of the Examples described herein further include determining a Hamming weight for each of the bit indices, and selecting a number of bit indices based on the determined Hamming weight, where the bit indices with a largest Hamming weight are selected, where the at least one rule comprises determining a Hamming weight for each of the bit indices and selecting a number of bit indices based on the determined Hamming weight.

In Example 35, the method of Example 26 or any of the Examples described herein further include transmitting the generated codeword.

Example 36 is a method for wireless communication. The method includes selecting a set of bit indices of an n-bit decoder to be shortened, the n-bit decoder having n inputs and n corresponding outputs, where each input and each corresponding output is associated with a bit index, initializing input bits of the n-bit decoder that are associated with the selected set of bit indices with a predetermined value, initializing the remaining input bits of the n-bit decoder with a likelihood ratio for each of the remaining input bits, and decoding the n input bits to obtain n output bits.

In Example 37, the method of Example 36 or any of the Examples described herein for selecting a set of bit indices to be shortened further includes identifying one or more of bit indices with associated outputs that are only a function of the corresponding input bits, where the set of bit indices to be shortened are selected from the identified one or more bit indices.

In Example 38, the method of Example 36 or any of the Examples described herein further include obtaining control information, and determining a codeword length and a code rate based on the obtained control information.

In Example 39, the method of Example 38 or any of the Examples described herein for selecting a set of bit indices to be shortened further includes determining a number of bit indices to select based on a difference between the determined codeword length and the n inputs of the n-bit decoder, where a number of bit indices in the set of bit indices to be shortened equals the determined number of bit indices.

In Example 40, the method of Example 38 or any of the Examples described herein for selecting a set of bit indices to be shortened further includes identifying a second subset of the bit indices as data indices based at least in part on the determined code rate and a determined error probability for each input bit of an encoder, and identifying any remaining bit indices as frozen indices.

In Example 41, the method of Example 40 or any of the Examples described herein further include discarding each output bit that is associated with an identified shortened index, discarding each output bit that is associated with an identified frozen index, and obtaining transmitted data from each output bit that is associated with an identified data index.

Example 42 is the method of Example 36 or any of the Examples described herein wherein selecting a set of bit indices to be shortened further includes selecting the set of bit indices to be shortened based on at least one rule.

In Example 43, the method of Example 42 or any of the Examples described herein further include selecting a number of last bit indices, wherein the at least one rule comprises selecting a number of last bit indices.

In Example 44, the method of Example 42 or any of the Examples described herein further include determining a Hamming weight for each of the bit indices, and selecting a number of bit indices based on the determined Hamming weight, where the bit indices with a largest Hamming weight are selected, where the at least one rule comprises determining a Hamming weight for each of the bit indices and selecting a number of bit indices based on the determined Hamming weight.

In Example 45, the method of Example 36 or any of the Examples described herein further include receiving a transmitted codeword having the determined codeword length.

Example 46 is an apparatus that includes means to perform the method of any of Examples 26-45 or any of the other Examples described herein.

Example 47 is a machine-readable storage including machine-readable instructions, that when executed, cause a processor to implement a method or realize an apparatus as claimed in any of claims 26-45, or any of the Examples described herein.

Embodiments and implementations of the systems and methods described herein may include various operations, which may be embodied in machine-executable instructions to be executed by a computer system. A computer system may include one or more general-purpose or special-purpose computers (or other electronic devices). The computer system may include hardware components that include specific logic for performing the operations or may include a combination of hardware, software, and/or firmware.

Computer systems and the computers in a computer system may be connected via a network. Suitable networks for configuration and/or use as described herein include one or more local area networks, wide area networks, metropolitan area networks, and/or Internet or IP networks, such as the World Wide Web, a private Internet, a secure Internet, a value-added network, a virtual private network, an extranet, an intranet, or even stand-alone machines which communicate with other machines by physical transport of media. In particular, a suitable network may be formed from parts or entireties of two or more other networks, including networks using disparate hardware and network communication technologies.

One suitable network includes a server and one or more clients; other suitable networks may contain other combinations of servers, clients, and/or peer-to-peer nodes, and a given computer system may function both as a client and as a server. Each network includes at least two computers or computer systems, such as the server and/or clients. A computer system may include a workstation, laptop computer, disconnectable mobile computer, server, mainframe, cluster, so-called "network computer" or "thin client," tablet, smart phone, personal digital assistant or other hand-held computing device, "smart" consumer electronics device or appliance, medical device, or a combination thereof.

Suitable networks may include communications or networking software, such as the software available from Novell®, Microsoft®, and other vendors, and may operate using TCP/IP, SPX, IPX, and other protocols over twisted pair, coaxial, or optical fiber cables, telephone lines, radio waves, satellites, microwave relays, modulated AC power lines, physical media transfer, and/or other data transmission "wires" known to those of skill in the art. The network may encompass smaller networks and/or be connectable to other networks through a gateway or similar mechanism.

Various techniques, or certain aspects or portions thereof, may take the form of program code (i.e., instructions) embodied in tangible media, such as floppy diskettes, CD-ROMs, hard drives, magnetic or optical cards, solid-state memory devices, a non-transitory computer-readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and nonvolatile memory and/or storage elements), at least one input device, and at least one output device. The volatile and nonvolatile memory and/or storage elements may be a RAM, an EPROM, a flash drive, an optical drive, a magnetic hard drive, or other medium for storing electronic data. The eNB (or other base station) and UE (or other mobile station) may also include a transceiver component, a counter component, a processing component, and/or a clock component or timer component. One or more programs that may implement or utilize the various techniques described herein may use an application programming interface (API), reusable controls, and the like. Such programs may be implemented in a high-level procedural or an object-oriented programming language to communicate with a computer system. However, the program(s) may be implemented in assembly or machine language, if desired. In any case, the language may be a compiled or interpreted language, and combined with hardware implementations.

Each computer system includes one or more processors and/or memory; computer systems may also include various input devices and/or output devices. The processor may include a general purpose device, such as an Intel®, AMD®, or other "off-the-shelf" microprocessor. The processor may include a special purpose processing device, such as ASIC, SoC, SiP, FPGA, PAL, PLA, FPLA, PLD, or other customized or programmable device. The memory may include static RAM, dynamic RAM, flash memory, one or more flip-flops, ROM, CD-ROM, DVD, disk, tape, or magnetic, optical, or other computer storage medium. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

It should be understood that many of the functional units described in this specification may be implemented as one or more components, which is a term used to more particularly emphasize their implementation independence. For example, a component may be implemented as a hardware circuit comprising custom very large scale integration (VLSI) circuits or gate arrays, or off-the-shelf semiconductors such as logic chips, transistors, or other discrete components. A component may also be implemented in programmable hardware devices such as field programmable gate arrays, programmable array logic, programmable logic devices, or the like.

Components may also be implemented in software for execution by various types of processors. An identified component of executable code may, for instance, comprise one or more physical or logical blocks of computer instructions, which may, for instance, be organized as an object, a procedure, or a function. Nevertheless, the executables of an identified component need not be physically located together, but may comprise disparate instructions stored in different locations that, when joined logically together, comprise the component and achieve the stated purpose for the component.

Indeed, a component of executable code may be a single instruction, or many instructions, and may even be distributed over several different code segments, among different programs, and across several memory devices. Similarly, operational data may be identified and illustrated herein within components, and may be embodied in any suitable form and organized within any suitable type of data structure. The operational data may be collected as a single data set, or may be distributed over different locations including over different storage devices, and may exist, at least partially, merely as electronic signals on a system or network. The components may be passive or active, including agents operable to perform desired functions.

Several aspects of the embodiments described will be illustrated as software modules or components. As used herein, a software module or component may include any type of computer instruction or computer-executable code located within a memory device. A software module may, for instance, include one or more physical or logical blocks of computer instructions, which may be organized as a routine, program, object, component, data structure, etc., that perform one or more tasks or implement particular data types. It is appreciated that a software module may be implemented in hardware and/or firmware instead of or in addition to software. One or more of the functional modules described herein may be separated into sub-modules and/or combined into a single or smaller number of modules.

In certain embodiments, a particular software module may include disparate instructions stored in different locations of a memory device, different memory devices, or different computers, which together implement the described functionality of the module. Indeed, a module may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Reference throughout this specification to "an example" means that a particular feature, structure, or characteristic described in connection with the example is included in at least one embodiment of the present disclosure. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples of the present disclosure may be referred to herein along with alternatives for the various components thereof. It is understood that such embodiments, examples, and alternatives are not to be construed as de facto equivalents of one another, but are to be considered as separate and autonomous representations of the present disclosure.

Furthermore, the described features, structures, or characteristics may be combined in any suitable manner in one or more embodiments. In the following description, numerous specific details are provided, such as examples of materials, frequencies, sizes, lengths, widths, shapes, etc., to provide a thorough understanding of embodiments of the disclosure. One skilled in the relevant art will recognize, however, that the disclosure may be practiced without one or more of the specific details, or with other methods, components, materials, etc. In other instances, well-known structures, materials, or operations are not shown or described in detail to avoid obscuring aspects of the disclosure.

It should be recognized that the systems described herein include descriptions of specific embodiments. These embodiments can be combined into single systems, partially combined into other systems, split into multiple systems or divided or combined in other ways. In addition, it is contemplated that parameters/attributes/aspects/etc. of one embodiment can be used in another embodiment. The parameters/attributes/aspects/etc. are merely described in one or more embodiments for clarity, and it is recognized that the parameters/attributes/aspects/etc. can be combined with or substituted for parameters/attributes/etc. of another embodiment unless specifically disclaimed herein.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive, and the disclosure is not to be limited to the details given herein, but may be modified within the scope and equivalents of the appended claims.

Those having skill in the art will appreciate that many changes may be made to the details of the above-described embodiments without departing from the underlying principles of the disclosure. The scope of the present disclosure should, therefore, be determined only by the following claims.

The invention claimed is:

1. An apparatus of a device for wireless communication in an evolved universal terrestrial radio access network (E-UTRAN), the apparatus comprising:
   an n-bit encoder having n inputs and n corresponding outputs, wherein each input and each corresponding output is associated with a bit index; and
   one or more processors to:
      select a set of bit indices to be shortened;
      encode, via the n-bit encoder, n input bits to obtain n output bits;
      ignore output bits that are associated with a bit index from the set of bit indices to be shortened;
      generate a codeword from the remaining output bits; and
      cause transmission of the codeword from the device over a cellular air interface to another device in the E-UTRAN.

2. The apparatus of claim 1, wherein the one or more processors to select a set of bit indices to be shortened are further to:
   identify one or more bit indices with associated outputs that are only a function of the corresponding inputs, wherein the set of bit indices to be shortened are selected from the identified one or more bit indices.

3. The apparatus of claim 1, wherein the one or more processors are further to:
obtain control information; and
determine a desired codeword length and a desired code rate based on the obtained control information.

4. The apparatus of claim 3, wherein the one or more processors to select a set of bit indices to be shortened are further to:
determine a number of bit indices to select based on a difference between the desired codeword length and the n output bits of the n-bit encoder, wherein a number of bit indices in the set of bit indices to be shortened equals the determined number of bit indices.

5. The apparatus of claim 3, wherein the one or more processors are further to:
determine an error probability for each of the n inputs;
identify the set of bit indices to be shortened as shortened indices;
identify a second subset of the bit indices as data indices based at least in part on the determined desired code rate and the determined error probability for each of the n inputs; and
identify any remaining bit indices as frozen indices.

6. The apparatus of claim 5, wherein the one or more processors are further to:
set the inputs for the shortened indices and the frozen indices to be predetermined values; and
set the inputs for the data indices using obtained data, wherein the set input values are encoded to obtain the n output bits.

7. The apparatus of claim 1, wherein the one or more processors to select a set of bit indices to be shortened are further to:
select the set of bit indices to be shortened based on at least one rule.

8. The apparatus of claim 7, wherein the at least one rule comprises a first rule where the one or more processors are to:
select a number of last bit indices.

9. The apparatus of claim 7, wherein the at least one rule comprises a second rule where the one or more processors are to:
determine a Hamming weight for each of the bit indices; and
select a number of bit indices based on the determined Hamming weight, wherein the bit indices with a largest Hamming weight are selected.

10. The apparatus of claim 1, further comprising:
transmission circuitry coupled to the one or more processors, the transmission circuitry to transmit the codeword from the device to said another device in the E-UTRAN over the cellular air interface.

11. An apparatus of a device for wireless communication in an evolved universal terrestrial radio access network (E-UTRAN), the apparatus comprising:
an n-bit decoder having n inputs and n corresponding outputs, wherein each input and each corresponding output is associated with a bit index; and
one or more processors to:
select a set of bit indices to be shortened;
initialize, with a predetermined value, input bits of the n-bit decoder that are associated with the selected set of bit indices;
initialize remaining input bits of the n-bit decoder with a likelihood ratio for each of the remaining input bits, wherein the remaining input bits correspond to bits of a codeword received by the device over a cellular air interface from another device in the E-UTRAN; and
decode, via the n-bit decoder, n input bits of the codeword to obtain n output bits.

12. The apparatus of claim 11, wherein the one or more processors to select a set of bit indices to be shortened are further to:
identify one or more of bit indices with associated outputs that are only a function of the corresponding input bits, wherein the set of bit indices to be shortened are selected from the identified one or more bit indices.

13. The apparatus of claim 11, wherein the one or more processors are further to: obtain control information; and
determine a codeword length and a code rate based on the obtained control information.

14. The apparatus of claim 13, wherein the one or more processors to select a set of bit indices to be shortened are further to:
determine a number of bit indices to select based on a difference between the determined codeword length and the n inputs of the n-bit decoder, wherein a number of bit indices in the set of bit indices to be shortened equals the determined number of bit indices.

15. The apparatus of claim 13, wherein the one or more processors are further to:
identify the set of bit indices to be shortened as shortened indices;
identify a second subset of the bit indices as data indices based at least in part on the determined code rate and a determined error probability for each input bit of an encoder; and identify any remaining bit indices as frozen indices.

16. The apparatus of claim 15, wherein the one or more processors are further to:
discard each output bit that is associated with an identified shortened index;
discard each output bit that is associated with an identified frozen index; and
obtain transmitted data from each output bit that is associated with an identified data index.

17. The apparatus of claim 11, further comprising:
reception circuitry coupled to the one or more processors, the reception circuitry to receive the codeword over the cellular air interface at the device from said another device in the E-UTRAN.

18. A method for wireless communication, comprising:
selecting a set of bit indices of an n-bit decoder to be shortened, the n-bit decoder having n inputs and n corresponding outputs, wherein each input and each corresponding output is associated with a bit index;
initializing, with a predetermined value, input bits of the n-bit decoder that are associated with the selected set of bit indices;
initializing remaining input bits of the n-bit decoder with a likelihood ratio for each of the remaining input bits, wherein the remaining input bits correspond to bits of a codeword received by the device over a cellular air interface from another device in the E-UTRAN; and
decoding, via the n-bit decoder, n input bits of the codeword to obtain n output bits.

19. The method of claim 18, wherein selecting the set of bit indices to be shortened comprises:
identifying one or more of bit indices with associated outputs that are only a function of the corresponding input bits, wherein the set of bit indices to be shortened are selected from the identified one or more bit indices.

20. The method of claim 18, further comprising:
obtaining control information; and
determining a codeword length and a code rate based on the obtained control information, wherein selecting the set of bit indices to be shortened comprises determining a number of bit indices to select based on a difference between the determined codeword length and the n inputs of the n-bit decoder, wherein a number of bit indices in the set of bit indices to be shortened equals the determined number of bit indices.

21. The method of claim 20, further comprising:
identifying the set of bit indices to be shortened as shortened indices;
identifying a second subset of the bit indices as data indices based at least in part on the determined code rate and a determined error probability for each input bit of an encoder; and
identifying any remaining bit indices as frozen indices.

22. The method of claim 21, further comprising:
discarding each output bit that is associated with an identified shortened index;
discarding each output bit that is associated with an identified frozen index; and
obtaining transmitted data from each output bit that is associated with an identified data index.

23. A non-transitory computer-readable storage medium having instructions stored thereon, that when executed by a processor of a device for wireless communication in an evolved universal terrestrial radio access network (E-UTRAN), cause the processor to perform operations including:
selecting a set of bit indices of an n-bit decoder to be shortened, the n-bit decoder having n inputs and n corresponding outputs, wherein each input and each corresponding output is associated with a bit index;
initializing, with a predetermined value, input bits of the n-bit decoder that are associated with the selected set of bit indices;
initializing remaining input bits of the n-bit decoder with a likelihood ratio for each of the remaining input bits, wherein the remaining input bits correspond to bits of a codeword received by the device over a cellular air interface from another device in the E-UTRAN; and
decoding, via the n-bit decoder, n input bits of the codeword to obtain n output bits.

24. The computer-readable storage medium of claim 23, wherein selecting the set of bit indices to be shortened comprises:
identifying one or more of bit indices with associated outputs that are only a function of the corresponding input bits, wherein the set of bit indices to be shortened are selected from the identified one or more bit indices.

* * * * *